(12) United States Patent
Itotani et al.

(10) Patent No.: US 11,178,759 B2
(45) Date of Patent: Nov. 16, 2021

(54) ELECTRONIC COMPONENT AND CAMERA MODULE

(71) Applicant: SONY SEMICONDUCTOR SOLUTIONS CORPORATION, Kanagawa (JP)

(72) Inventors: Ryo Itotani, Kanagawa (JP); Yuta Momiuchi, Kanagawa (JP); Hirokazu Nakayama, Kanagawa (JP); Tooru Kai, Oita (JP); Miyoshi Togawa, Oita (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/471,433

(22) PCT Filed: Nov. 21, 2017

(86) PCT No.: PCT/JP2017/041740
§ 371 (c)(1),
(2) Date: Jun. 19, 2019

(87) PCT Pub. No.: WO2018/142727
PCT Pub. Date: Aug. 9, 2018

(65) Prior Publication Data
US 2019/0387623 A1    Dec. 19, 2019

(30) Foreign Application Priority Data

Jan. 31, 2017 (JP) .............................. JP2017-015843

(51) Int. Cl.
*H05K 7/10* (2006.01)
*H05K 7/12* (2006.01)
(Continued)

(52) U.S. Cl.
CPC .............. *H05K 1/111* (2013.01); *G03B 17/02* (2013.01); *H01L 23/12* (2013.01); *H01L 25/04* (2013.01);
(Continued)

(58) Field of Classification Search
CPC . H05K 1/111; H05K 1/18; H05K 3/32; G03B 17/02; H04N 5/2252; H04N 5/2257;
(Continued)

(56) References Cited

U.S. PATENT DOCUMENTS 5,506,401 A * 4/1996 Segawa ............. H01L 27/14618
250/208.1
6,121,686 A * 9/2000 Togawa ............. H01L 23/3128
257/778
(Continued)

FOREIGN PATENT DOCUMENTS

JP    2001-345391 A    12/2001
JP    2004-221874 A    8/2004
(Continued)

OTHER PUBLICATIONS

International Search Report and Written Opinion of PCT Application No. PCT/JP2017/041740, dated Feb. 20, 2018, 07 pages of ISRWO.

*Primary Examiner* — Yuriy Semenenko
(74) *Attorney, Agent, or Firm* — Chip Law Group

(57) ABSTRACT

To enhance reliability of an electronic component. There is provided an electronic component including a base material having a first face and a second face, a first layer provided on the first face of the base material and including a plurality of pads connected to a plurality of bumps of a chip flip-chip mounted on the first face of the base material, respectively, and a second layer provided on the second face of the base material, in which a contacting member arranged at apart
(Continued)

contacting with the second face of the base material at a position corresponding to each of the plurality of pads in the second layer is made of the same material.

10 Claims, 22 Drawing Sheets

(51) Int. Cl.
| | |
|---|---|
| *H05K 1/11* | (2006.01) |
| *G03B 17/02* | (2021.01) |
| *H01L 23/12* | (2006.01) |
| *H01L 25/04* | (2014.01) |
| *H01L 27/146* | (2006.01) |
| *H04N 5/225* | (2006.01) |
| *H04N 5/369* | (2011.01) |
| *H05K 1/18* | (2006.01) |
| *H05K 3/32* | (2006.01) |

(52) U.S. Cl.
CPC ..... *H01L 27/14601* (2013.01); *H04N 5/2252* (2013.01); *H04N 5/2257* (2013.01); *H04N 5/369* (2013.01); *H05K 1/18* (2013.01); *H05K 3/32* (2013.01)

(58) Field of Classification Search
CPC ........... H04N 5/369; H04N 2005/2255; H04N 5/2253; H04N 5/225; H04N 5/335; H01L 25/18; H01L 23/12; H01L 25/04; H01L 27/14601; H01L 25/0655; H01L 27/14618; H01L 23/49894; H01L 23/49811
See application file for complete search history.

(56) References Cited

U.S. PATENT DOCUMENTS

| | | | | |
|---|---|---|---|---|
| 6,784,409 | B2* | 8/2004 | Kitani | H01L 27/14618 250/208.1 |
| 7,893,992 | B2* | 2/2011 | Vittu | G03B 17/12 348/374 |
| 9,607,947 | B2* | 3/2017 | Karhade | H01L 23/49894 |
| 2004/0178486 | A1* | 9/2004 | Maeda | H05K 1/0271 257/678 |
| 2008/0135283 | A1* | 6/2008 | Hibino | H01L 24/81 174/260 |
| 2014/0008679 | A1* | 1/2014 | Deguchi | H01L 31/0203 257/98 |
| 2015/0001733 | A1* | 1/2015 | Karhade | H01L 23/49894 257/774 |
| 2018/0213653 | A1* | 7/2018 | Tago | H05K 3/0011 |

FOREIGN PATENT DOCUMENTS

| | | | |
|---|---|---|---|
| JP | 2009-071036 A | | 4/2009 |
| JP | WO2017065028 | * | 4/2017 |

* cited by examiner

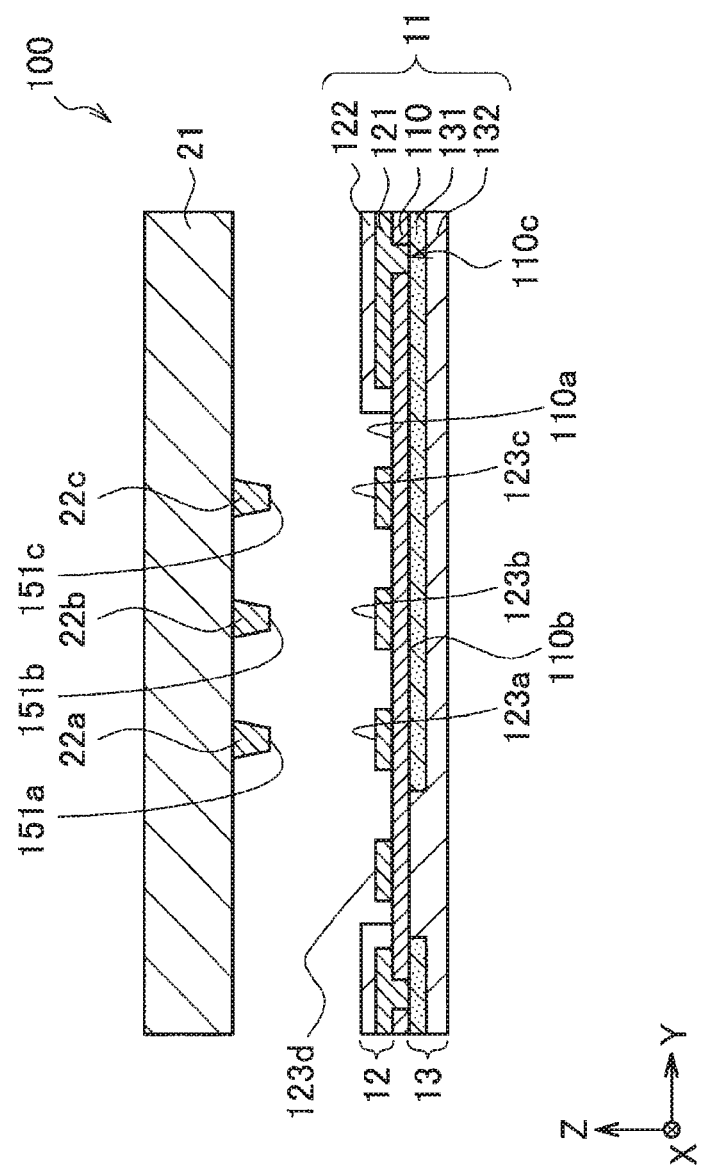

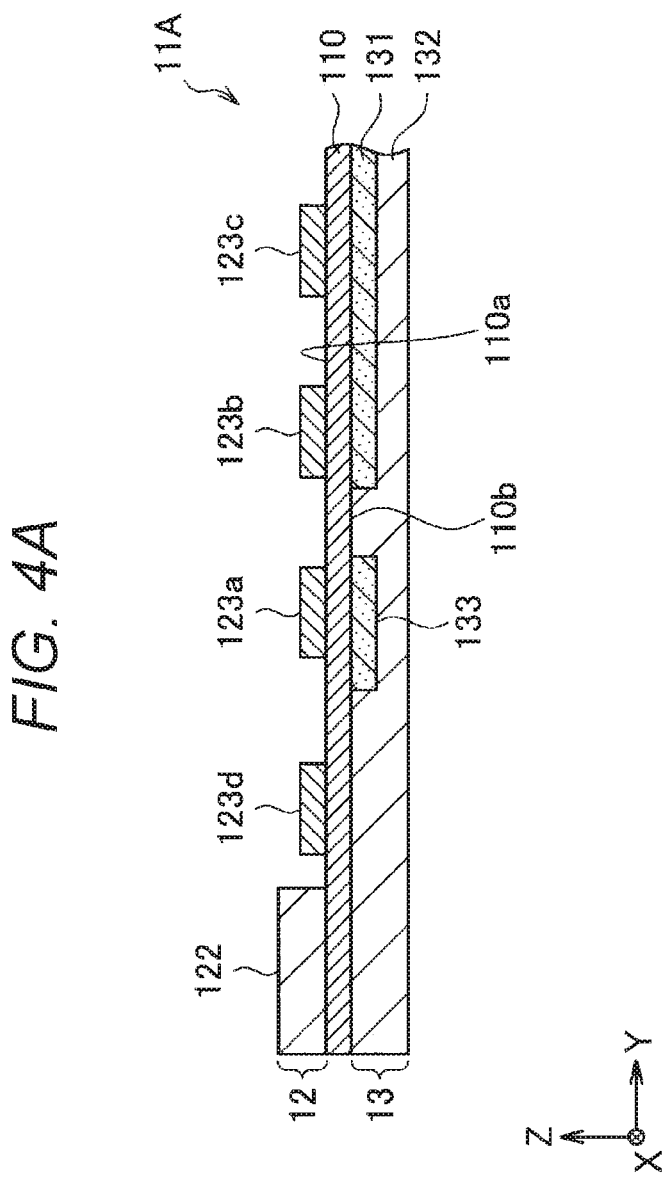

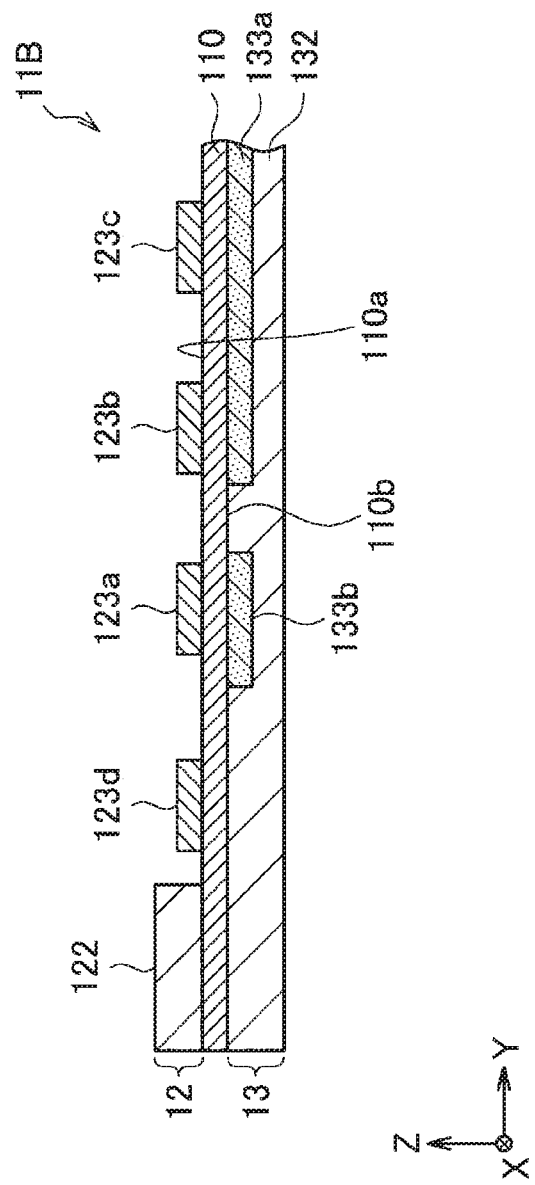

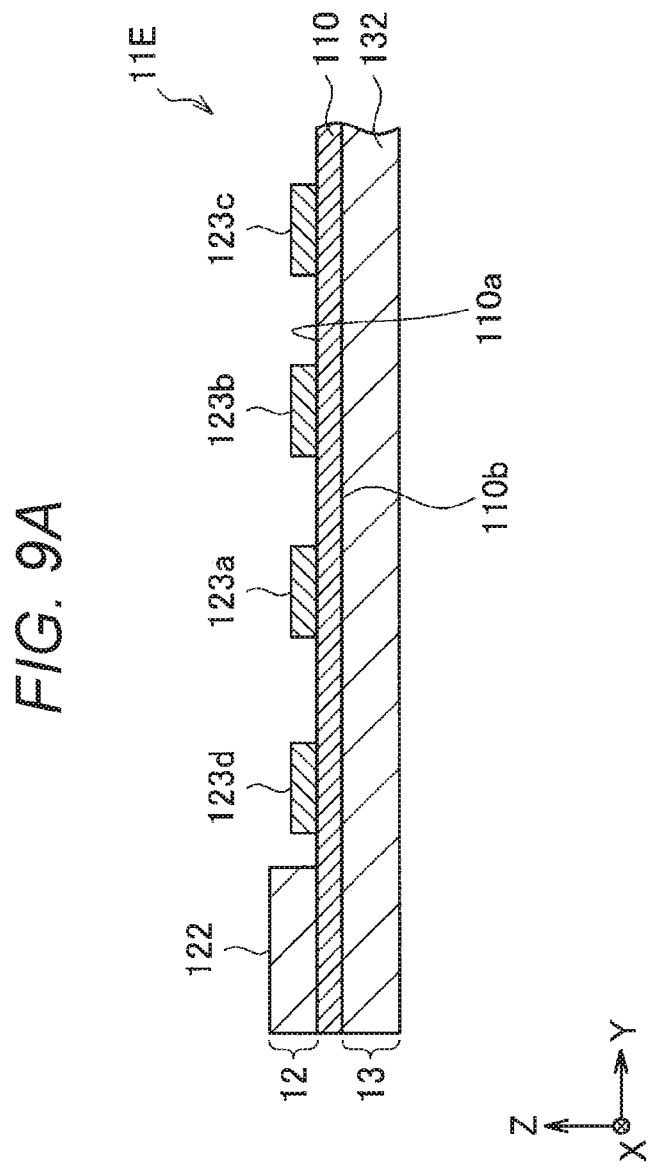

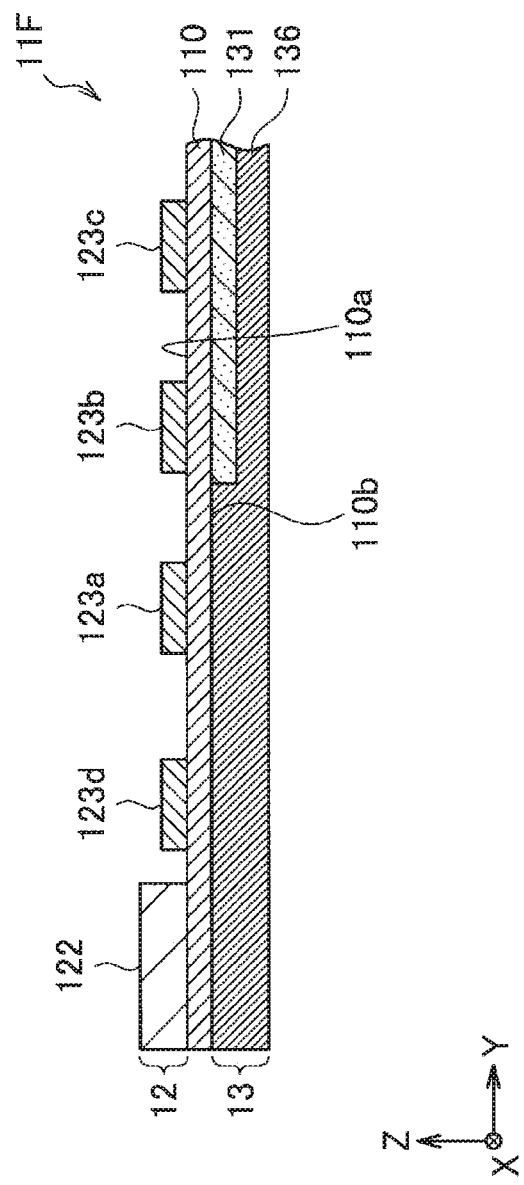

ELECTRONIC COMPONENT AND CAMERA MODULE

CROSS REFERENCE TO RELATED APPLICATIONS

This application is a U.S. National Phase of International Patent Application No. PCT/JP2017/041740 filed on Nov. 21, 2017, which claims priority benefit of Japanese Patent Application No. JP 2017-015843 filed in the Japan Patent Office on Jan. 31, 2017. Each of the above-referenced applications is hereby incorporated herein by reference in its entirety.

TECHNICAL FIELD

The present disclosure relates to an electronic component and a camera module.

BACKGROUND ART

In recent years, an advanced process such as flip-chip mounting has been introduced into semiconductor chips such as image sensor mounted on a camera module realizing a shooting function of various shooting apparatuses, and chip shrink has increasingly advanced.

For example, Patent Document 1 described below discloses a technology for an electronic component having an imaging device flip-chip mounted on a circuit board.

CITATION LIST

Patent Document

Patent Document 1: Japanese Patent Application Laid-Open No. 2001-345391

SUMMARY OF THE INVENTION

Problems to be Solved by the Invention

However, when bumps formed at terminals of a chip are bonded to terminals (pads) of a circuit board in flip-chip mounting the chip on the circuit board, the bonding performance may not be stable depending on a wiring pattern formed on the circuit board. In this case, there is a high possibility that the circuit board and the chip are disconnected from each other and a failure is caused in the electronic component.

Therefore, the present disclosure proposes a novel and improved electronic component capable of enhancing reliability of the electronic component, and a camera module.

Solutions to Problems

According to the present disclosure, there is provided an electronic component including a base material having a first face and a second face, a first layer provided on the first face of the base material and including a plurality of pads connected to a plurality of bumps of a chip flip-chip mounted on the first face of the base material, respectively, and a second layer provided on the second face of the base material, in which a contacting member arranged at a part contacting with the second face of the base material at a position corresponding to each of the plurality of pads in the second layer is made of the same material.

Further, according to the present disclosure, there is provided a camera module including a circuit board including a base material having a first face and a second face, a first layer provided on the first face of the base material and including a plurality of pads connected to a plurality of bumps of an imaging device flip-chip mounted on the first face of the base material, respectively, and a second layer provided on the second face of the base material, a translucent member provided opposite to a side of the circuit board where the imaging device is provided, and a lens unit provided opposite to a side of the translucent member opposing the circuit board, in which a contacting member arranged at a part contacting with the second face of the base material at a position corresponding to each of the plurality of pads in the second layer is made of the same material.

Effects of the Invention

As described above, according to the present disclosure, it is possible to enhance reliability of the electronic component.

Additionally, the above effect is not necessarily restrictive, and any effect described in the present specification or other effect graspable from the present specification may be obtained together with the above effect or instead of the above effect.

BRIEF DESCRIPTION OF DRAWINGS

FIG. 2A is a cross-section view illustrating an exemplary configuration of a circuit board and an imaging device at a flip-chip bonding part in an electronic component according to the embodiment.

FIG. 4A is a cross-section view illustrating an exemplary configuration of a circuit board at the flip-chip bonding part in the electronic component according to a second embodiment of the present disclosure.

FIG. 5A is a cross-section view illustrating an exemplary configuration of a circuit board at the flip-chip bonding part in the electronic component according to a third embodiment of the present disclosure.

FIG. 9A is a cross-section view illustrating an exemplary configuration of a circuit board at the flip-chip bonding part in the electronic component according to a sixth embodiment of the present disclosure.

FIG. 10 is a cross-section view illustrating an exemplary configuration of a circuit board at the flip-chip bonding part in the electronic component according to a seventh embodiment of the present disclosure.

MODE FOR CARRYING OUT THE INVENTION

Figure 1:
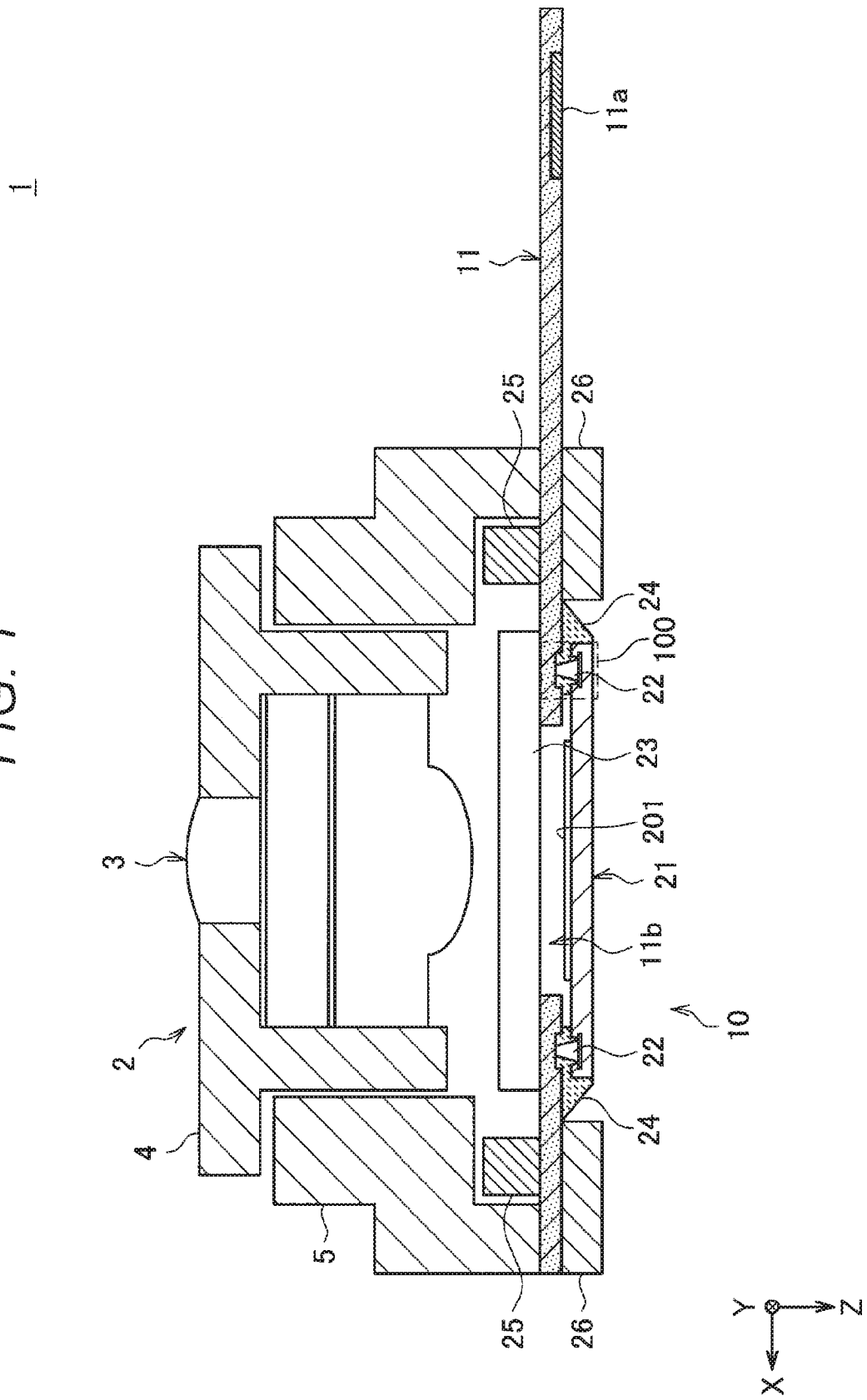
FIG. 1 is a cross-section view illustrating a schematic configuration of a camera module according to a first embodiment of the present disclosure.

Preferred embodiments of the present disclosure will be described below in detail with reference to the accompanying drawings. Additionally, the constituents having substantially the same functional configuration are denoted with the same reference numeral and a repeated description thereof will be omitted in the present specification and the drawings.

Further, the elements having substantially the same functional configuration may be discriminated by different alphabets after the same reference numeral in the present specification and the drawings. However, in a case where a plurality of elements having substantially the same functional configuration does not need to be particularly discriminated, only the same reference numeral is denoted.

Additionally, the description will be made in the following order.

1. Outline
2. First Embodiment
2.1. Schematic configuration of camera module
2.2. Configuration of flip-chip bonding part
3. Second Embodiment
4. Third Embodiment
5. Fourth Embodiment
6. Fifth Embodiment
7. Sixth Embodiment
8. Seventh Embodiment
9. Application to in-vivo information acquisition system
10. Application to endoscopic surgery system
11. Application to moving object
12. Conclusion

1. OUTLINE

An electronic component according to a related technology will be described prior to describing an electronic component mounted on a camera module according to one embodiment of the present disclosure. Additionally, an electronic component in the present disclosure means an electronic component in which an imaging device as image sensor is flip-chip mounted on a circuit board, but the imaging device is an exemplary chip. That is, any kind of chip capable of being flip-chip mounted on a circuit board is possible, and the kinds of chip (such as large-scale integrated circuit (LSI) chip, for example) are not limited.

Figure 16A:
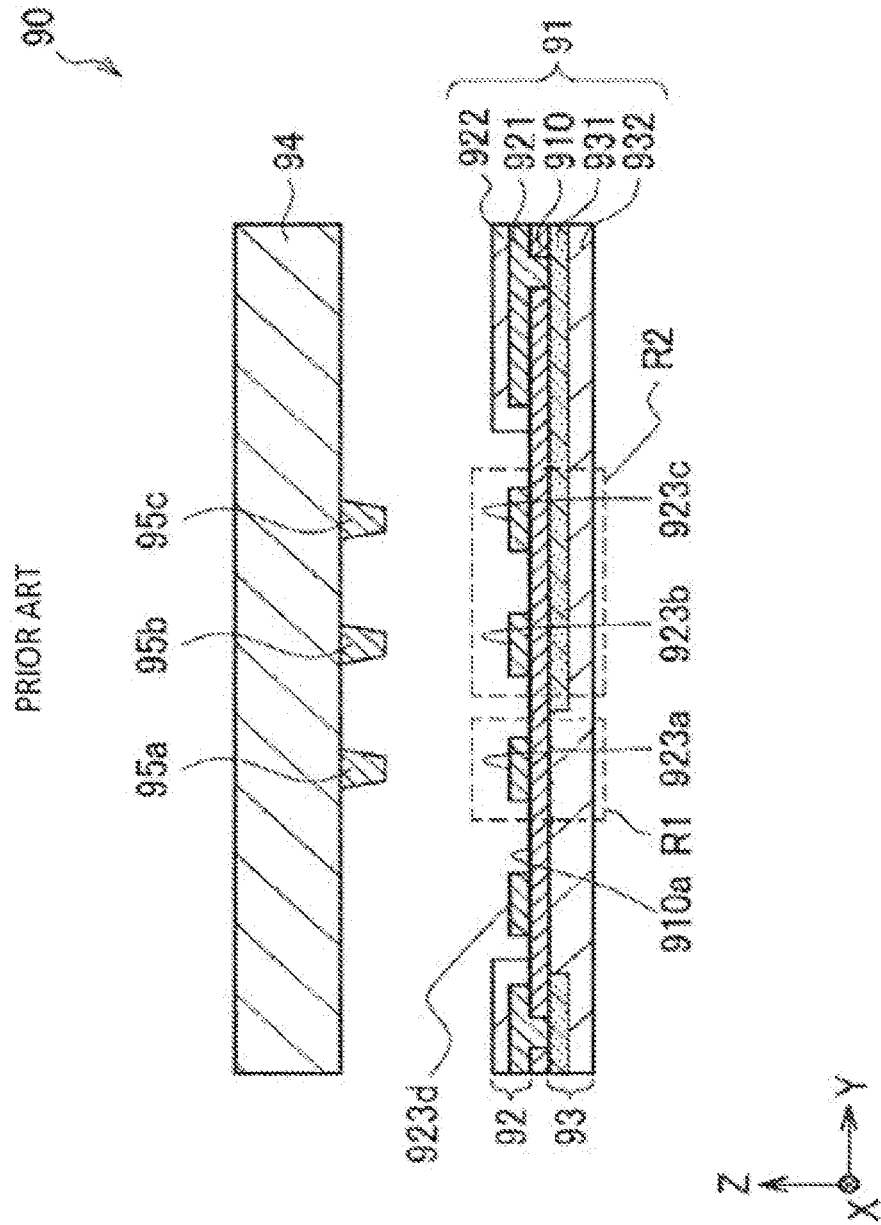
FIG. 16A is a cross-section view illustrating an exemplary configuration of a circuit board and an imaging device at a flip-chip bonding part in an electronic component according to a related technology.
Figure 16B:
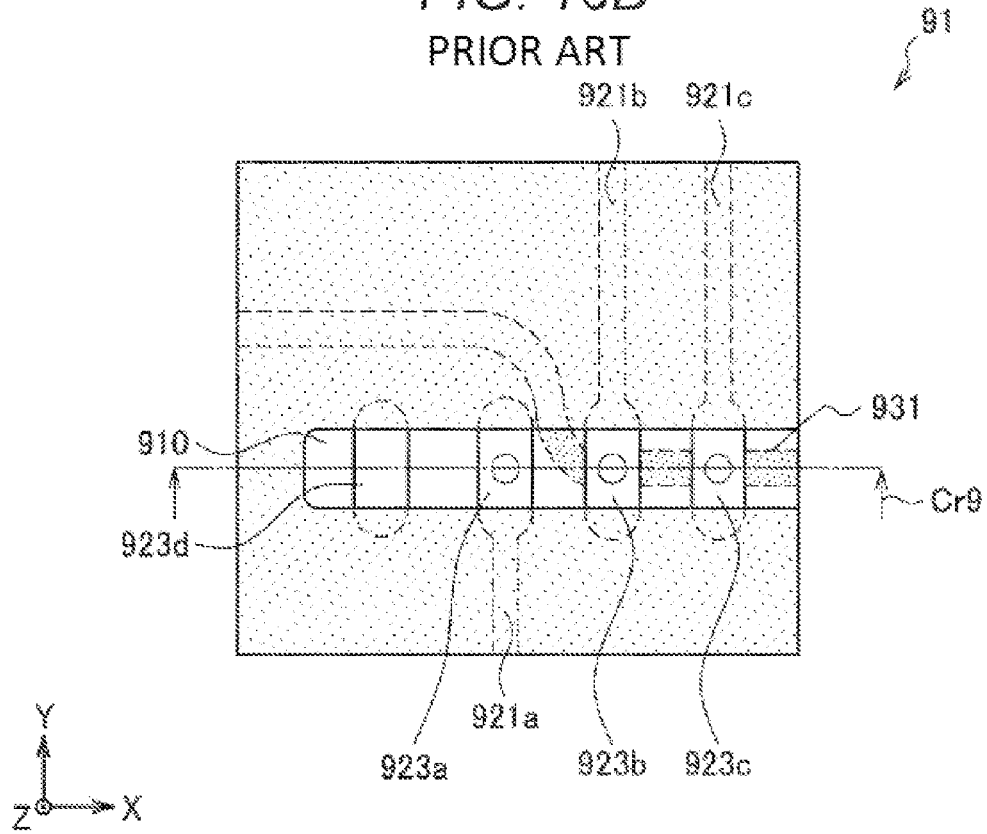
FIG. 16B is a top view illustrating an exemplary configuration of the circuit board at the flip-chip bonding part in the electronic component according to the related technology.

FIG. 16A and FIG. 16B are a cross-section view illustrating an exemplary configuration of a circuit board 91 and an imaging device 94 and a top view illustrating an exemplary configuration of the circuit board 91 at a flip-chip bonding part in an electronic component 90 according to a related technology. The cross-section view illustrated in FIG. 16A is a side cross-section view along a cut line Cr9 of the top view illustrated in FIG. 16B.

As illustrated in FIG. 16A and FIG. 16B, the circuit board 91 includes a base material 910, a first layer 92, and a second layer 93. The circuit board 91 can be a multilayered flexible wiring board or rigid flexible wiring board. The first layer 92 is on the side of a face 910a on the surface layer side of the base material 910 opposing the imaging device 94, and the second layer 93 is inwardly deeper than the first layer 92.

Wiring 921 (921a to 921c) and a resist part 922 are formed in the first layer 92. Pads 923 (923a to 923c) corresponding to bumps 95 formed at terminals of the imaging device 94 are provided at ends of the wiring 921. Further, a pad 923d that is not connected to wiring 921 is provided in addition to the pads 923a to 923c. Further, wiring 931 and a resist part 932 are formed in the second layer 93. The wiring 921 and the wiring 931 can be connected through interlayer connection vias formed in the base material 910.

Further, the bumps 95a to 95c are formed at terminals of the imaging device 94 opposing the circuit board 91. The bumps 95a to 95c can be bonded to the pads 923a to 923c on flip-chip mounting.

Each of the pads 923a to 923c is pressed against each of the bumps 95a to 95c on flip-chip mounting. Thereby, the pads 923a to 923c are pushed downward.

Here, as illustrated in FIG. 16B, while the wiring 931 is formed at parts corresponding to the pads 923b and 923c in the Z-axis direction in the second layer 93 (see a region R2), the wiring 931 is not formed below the pad 923a (see a region R1) in the Z-axis direction. That is, the materials making the parts corresponding to the pads 923a to 923c in the second layer 93 are different. Thereby, a mechanical behavior of the pad 923a can be different from that of the pad 923b and the pad 923c when pushed by the bumps 95a to 95c. Specifically, the resist part 932 is formed below the pad 923a in the second layer 93, and the wiring 931 is formed below the pads 923b and 923c in the second layer 93. The two members have different degrees of elasticity, and thus the pressure forces of the bumps 95 onto the pads 923 are different on flip-chip mounting. Thereby, a bonding intensity at a flip-chip bonding part can be different between the pads.

In this case, a problem in which the bonding performance is not stable can be caused. For example, in a case where the bonding intensities at the flip-chip bonding parts vary, a bonding part with the lowest bonding intensity can be caused, and thus a failure is increasingly likely to occur at the flip-chip bonding part.

Thus, each of the contacting members arranged at parts contacting with the base material at a position corresponding to each of the pads connected to each of the bumps in the second layer of the circuit board is made of the same material in an electronic component according to one embodiment of the present disclosure. With the configuration, behaviors of mutually-pressing bumps and pads can be constant at a plurality of bonding parts of the bumps and the pads on flip-chip mounting. Thereby, the bonding performance between the bumps and the pads can be stable. Therefore, a failure is less likely to occur at the bonding parts, thereby enhancing reliability of the electronic component.

An electronic component according to each embodiment of the present disclosure will be described below.

2. FIRST EMBODIMENT

A first embodiment of the present disclosure will be first described.

<2.1. Schematic Configuration of Camera Module>

FIG. 1 is a cross-section view illustrating a schematic configuration of a camera module 1 according to the first embodiment of the present disclosure. As illustrated in FIG. 1, the camera module 1 includes a lens unit 2, an electronic component 10, and a reinforcement plate 26. Additionally, the camera module 1 according to the present embodiment can be mounted on any apparatus having a shooting function, such as digital camera, Smartphone, cell phone, tablet, notebook-type personal computer (PC), home electronics, industrial devices, laboratory devices, transport machinery, or the like.

As illustrated in FIG. 1, the lens unit 2 includes a group of lenses 3, a holder 4 for fixing and supporting the group of lenses 3, and a housing 5 for supporting the holder 4 to be vertically movable. The above-described lens unit 2 is realized by a well-known lens unit. The lens unit 2 to be employed can be determined as needed by the specification of an imaging device 21 or the design items of the electronic component 10.

As illustrated in FIG. 1, the electronic component 10 includes a circuit board 11, the imaging device 21, bumps 22, a translucent member 23, encapsulation resin 24, and a passive component 25.

Further, the reinforcement plate 26 can be provided for supporting the lens unit 2 and the electronic component 10. In the example illustrated in FIG. 1, the reinforcement plate 26 can be provided on the side of a lower face of the circuit board 11 and below the housing 5 in order to restrict the circuit board 11 from bending due to the weight of the lens unit 2.

The circuit board 11 can be a flexible board, a rigid flexible board, or the like made of a base material such as polyimide, for example. An external terminal 11a capable of being electrically connected to other device can be formed on the lower face of the circuit board 11. Further, the circuit board 11 includes a main opening 11b. Light collected by the group of lenses 3 in the lens unit 2 can pass through the main opening 11b and enter a light receiving face 201 of the imaging device 21. Additionally, a specific configuration of the circuit board 11 will be described below.

The imaging device 21 is an image sensor such as complementary metal oxide semiconductor (CMOS) image sensor, for example. The imaging device 21 includes, for example, the light receiving face 201 in which unit pixels including photoelectric conversion devices (simply denoted as pixels below) are two-dimensionally arranged in a matrix shape, and senses the amount of charges depending on the amount of light incident into the light receiving face 201 as the physical amount in units of pixel.

The imaging device 21 is flip-chip mounted on the opposite side of the circuit board 11 to the side where the lens unit 2 is provided. The imaging device 21 is provided at a part corresponding to the main opening 11b of the circuit board 11, for example. That is, the imaging device 21 is provided such that the light receiving face 201 of the imaging device 21 opposes the main opening 11b of the circuit board 11. Here, the bumps 22 formed at terminals of the imaging device 21 are bonded to terminals (pads) of the wiring provided on the circuit board 11 so that the imaging device 21 is electrically connected to the circuit board 11. A detailed configuration of the circuit board 11 and the imaging device 21 at the flip-chip bonding part will be described below.

The bumps 22 are protruded terminals formed on the terminals (not illustrated) of the imaging device 21. The bumps 22 are made of a metal such as gold, for example. The bumps 22 can be bonded to the pads of the circuit board 11 when the imaging device 21 is flip-chip mounted on the circuit board 11. Thereby, the imaging device 21 and the circuit board 11 are electrically connected to each other.

The translucent member 23 is made of a translucent material such as glass or resin film, for example. The translucent member 23 may be an infrared ray cut filter (IRCF) made of glass, resin film, or the like having an infrared ray absorption function, for example, in order to restrict an occurrence of red color. Further, an IRCF as optical filter having an infrared ray absorption material may be adhered on the upper face or the lower face of the translucent member 23.

The translucent member 23 is provided on the opposite side of the circuit board 11 to the side where the imaging device 21 is provided. It is preferable that the translucent member 23 is as large as it is positioned at least above the bumps 22 such that the bonding intensity between the pads and the bumps 22 is kept at a certain level or more. Further, the mutually-opposed faces of the circuit board 11 and the translucent member 23 can be bonded by adhesive resin (not illustrated).

The encapsulation resin 24 is thermosetting, photocurable, or photothermal curable resin, and is a member for sealing between the circuit board 11 and the imaging device 21. The encapsulation resin 24 is filled and hardened between the circuit board 11 and the imaging device 21 so that the circuit board 11 and the imaging device 21 are fixed to each other. The encapsulation resin 24 is filled in the gap between the circuit board 11 and the imaging device 21, and then is irradiated by light such as ultraviolet ray or heated to be hardened.

The passive component 25 is a passive device realized by a chip capacitor, capacitor, or the like. The passive component 25 to be employed can be determined as needed by the design items of the electronic component 10.

<2.2. Configuration of Flip-Chip Bonding Part>

A configuration of a flip-chip bonding part in the electronic component 10 according to the present embodiment will be described below. Additionally, the flip-chip bonding part according to the present embodiment means a part which is surrounded in a region 100 in a broken line in FIG. 1 and where a pad and a bump 22 are bonded.

Figure 2B:
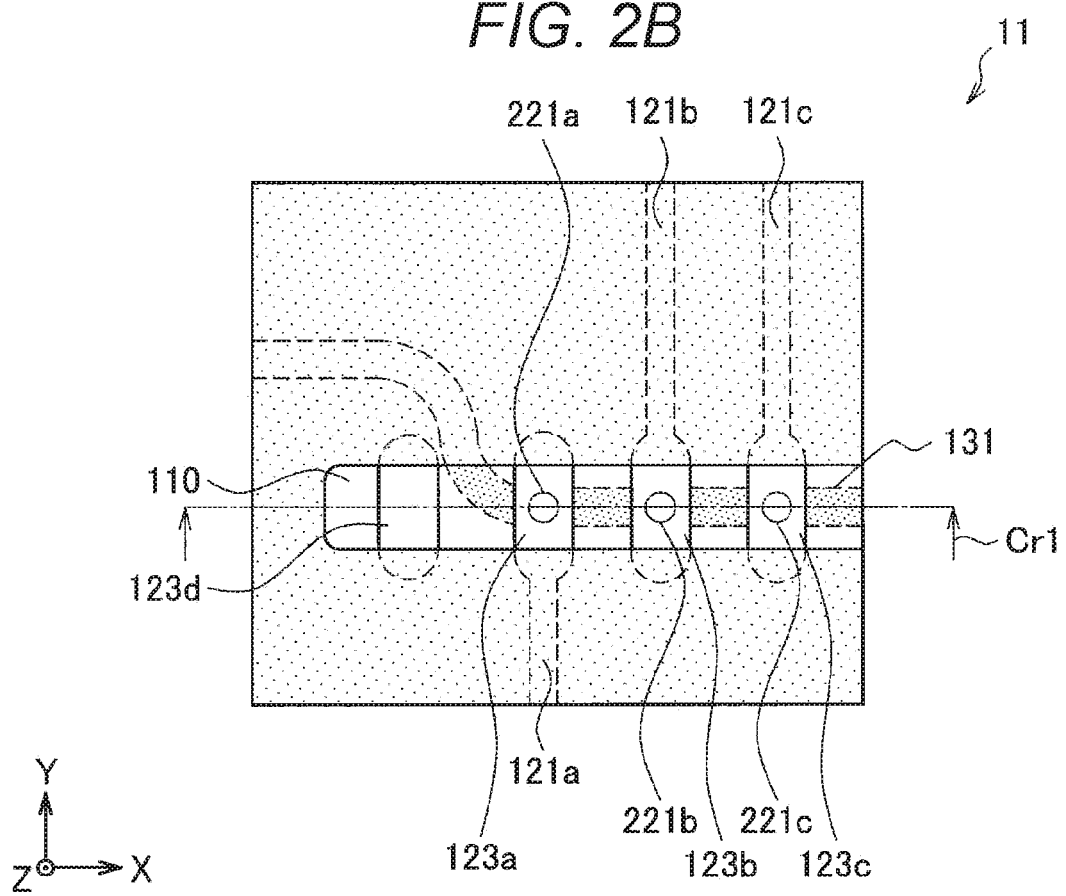
FIG. 2B is a top view illustrating an exemplary configuration of the circuit board at the flip-chip bonding part in the electronic component according to the embodiment.

FIG. 2A is a cross-section view illustrating an exemplary configuration of the circuit board 11 and the imaging device 21 at a flip-chip bonding part 100 in the electronic component 10 according to the present embodiment. Further, FIG. 2B is a top view illustrating an exemplary configuration of the circuit board 11 at the flip-chip bonding part 100. The cross-section view illustrated in FIG. 2A is a side cross-section view along a cut line Cr1 of the top view illustrated in FIG. 2B.

Additionally, FIG. 2A and FIG. 2B illustrate a configuration of the circuit board 11 and the imaging device 21 before flip-chip mounting for description. In flip-chip mounting, the circuit board 11 and the imaging device 21 relatively approach in the Z-axis direction, and the bumps 22 and pads 123 are bonded.

As illustrated in FIG. 2A, the circuit board 11 includes a base material 110 (corresponding to a first base material), a first layer 12, and a second layer 13. The first layer 12 is on the side of a first face 110a of the base material 110. The first face 110a opposes the imaging device 21, or is on the surface layer side as illustrated in FIG. 2A. Further, the second layer 13 is on the side of a second face 110b of the base material 110, and is inwardly deeper than the first layer 12. Additionally, the second face 110b is opposite to the first face 110a.

Additionally, the circuit board 11 according to the present embodiment can be a multilayered board, for example. In this case, the base material 110 is provided on the outermost surface layer of the circuit board 11. Further, the first layer 12 can be the outermost surface layer of the circuit board 11 and the second layer 13 can be inwardly deeper than the outermost surface layer. Additionally, the number of layers in the circuit board 11 is not particularly limited.

With reference to FIG. 2A and FIG. 2B, wiring 121 (121a to 121c) and a resist part 122 are formed in the first layer 12. The wiring 121 is formed on the first face 110a of the base material 110. Further, the resist part 122 is formed to cover the wiring 121 on the first face of the base material 110.

The pads 123 (123a to 123c) corresponding to the bumps 22 formed at the terminals of the imaging device 21 are provided at the ends of the wiring 121. Further, a pad 123d independent of the circuit formed in the circuit board 11 may be provided in the first layer 12 in addition to the pads 123a to 123c. The bumps 22 and the pads 123 can be arranged side by side in the Y-axis direction in the Figure.

Further, wiring 131 and a resist part 132 are formed in the second layer 13. The wiring 131 is formed on the second face 110b of the base material 110. Further, the resist part 132 is formed to cover the wiring 131 on the second face of the base material 110. The wiring 121 and the wiring 131 can be connected through an interlayer connection via 110c formed in the base material 110, for example.

Additionally, the wiring 121 and the wiring 131 can be formed on the respective faces of the base material 110 by use of a metal such as copper, for example. Further, the wiring 121 and the wiring 131 are discriminated in different colors for description in FIG. 2A and FIG. 2B, but they can be made of the same material. Further, the resist part 122 and the resist part 132 can be made of a well-known resist member for manufacturing semiconductor chips, for example.

Further, the bumps 22a to 22c are formed on the terminals of the imaging device 21 on the face opposing the circuit board 11. The bumps 22a to 22c can be bonded to the pads 123a to 123c on flip-chip mounting. For example, the bumps 22a to 22c can contact with the pads 123a to 123c at their top faces 151a to 151c in the regions 221a to 221c at the center of the pads 123a to 123c, and can be bonded to the pads 123a to 123c as illustrated in FIG. 2B.

Here, as illustrated in FIG. 2A and FIG. 2B, the wiring 131 is transversely formed at the parts corresponding to the pads 123a to 123c in the Z-axis direction in the second layer 13. That is, the parts corresponding to the pads 123a to 123c in the second layer 13 include the same material. In this case, the wiring 131 at the parts corresponding to the pads 123a to 123c corresponds to a contacting member.

Each of the pads 123a to 123c is pressed against each of the bumps 22a to 22c on flip-chip mounting. At this time, the pads 123a to 123c are pushed downward.

According to the present embodiment, the mechanical behaviors of the pads 123a to 123c can be the same when pushed by the bumps 22a to 22c. This is because the common member or the wiring 131 is formed on the second face 110b of the base material 110 as a contacting member corresponding to each of the pads 123 and thus the materials making the grounds of the pads 123 are also common. Thus, the mechanical behaviors of the pads 123 can be constant in the pads 123 when pushed by the bumps 22. Thereby, the bonding performance at the flip-chip bonding parts 100 can be stable.

The bonding performance at the flip-chip bonding parts 100 is stable so that the bonding strengths at the flip-chip bonding parts 100 vary less. Therefore, a failure can be substantially prevented from occurring at the flip-chip bonding parts 100, thereby enhancing reliability of the electronic component 90.

Additionally, the behaviors when the bumps 22 and the pads 123 are pressed against each other is mainly influenced by the configuration in the region down to the lower layer part of the pads 123 (or the base material 110 and the part in the second layer 13 contacting with the base material 110). Therefore, the bonding performance at the flip-chip bonding parts 100 can be stable as long as at least the material making the contacting members in the second layer 13 contacting with the second face 110b of the base material 110 is common in the respective pads 123 as described in the present embodiment.

Further, in a case where the circuit board 11 is a multilayered board, the bonding performance at the flip-chip bonding parts 100 can be further stabilized if the material making the contacting members at the positions corresponding to the pads 123 is common in the layer inwardly deeper than the second layer 13.

Further, the pad 123d is an independent part in the circuit board 11. Thus, the part in the second layer 13 corresponding to the pad 123d may not be made of the common material (such as the wiring 131) with the pads 123a to 123c. Of course the wiring 131 may be formed at the part corresponding to the pad 123d.

Further, in the example illustrated in FIG. 2A and FIG. 2B, one wiring 131 is arranged at the positions corresponding to the pads 123a to 123c, but a plurality of pieces of wiring may be arranged at the positions corresponding to the pads 123a to 123c, respectively.

Further, the positions where the wiring 131 is formed for the pads 123 are not particularly limited, but the formation positions can influence further enhancement in bonding performance. FIGS. 3A, 3B, 3C, and 3D are schematic diagrams illustrating exemplary positions where the wiring 131 is formed for a pad 123. The positional relationship between a pad 123 and the wiring 131 in each diagram is a positional relationship in a case where the circuit board 11 is viewed from above as illustrated in FIG. 2B.

Figure 3A:
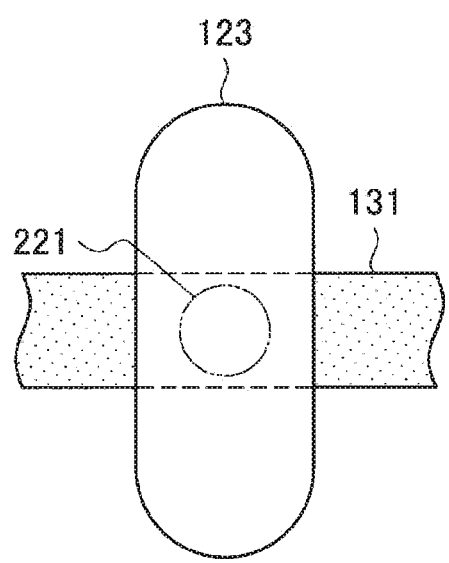
FIG. 3A is a schematic diagram illustrating an exemplary position where wiring is formed for a pad.

In the example illustrated in FIG. 3A, a region 221 on the contact face where the bump 22 and the pad 123 contact with each other is included in the wiring 131 in plan view. With the configuration, the material of the lower layer in the region 221 on the contact face is the material of the wiring 131, or a single material is employed. Thus, the contact pressure between the bump 22 and the pad 123 in the region 221 on the contact face is not largely deviated. Thus, the bonding performance at the flip-chip bonding parts 100 can be further stabilized.

Figure 3B:
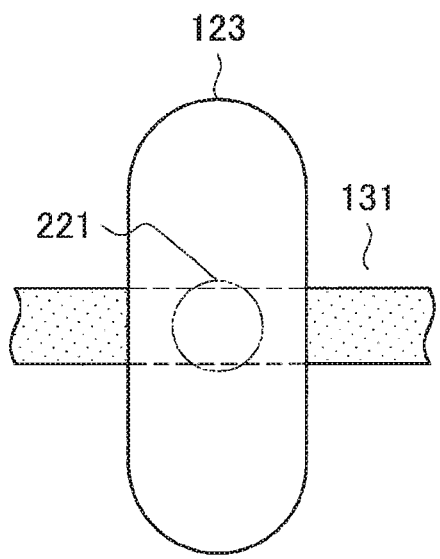
FIG. 3B is a schematic diagram illustrating an exemplary position where the wiring is formed for a pad.
Figure 3C:
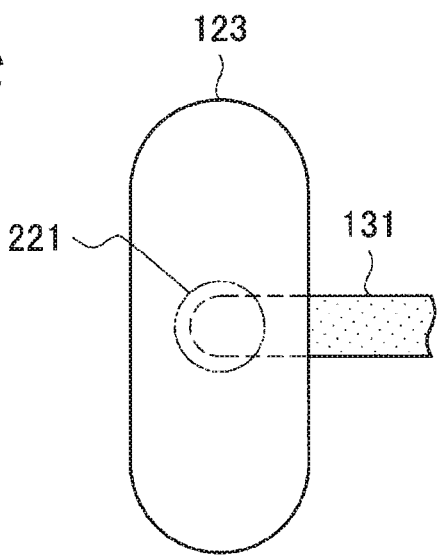
FIG. 3C is a schematic diagram illustrating an exemplary position where the wiring is formed for a pad.
Figure 3D:
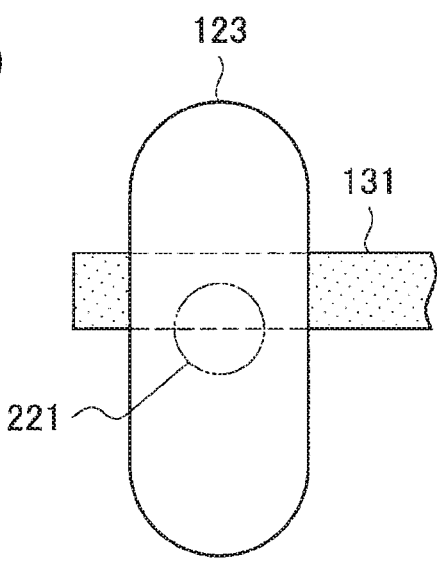
FIG. 3D is a schematic diagram illustrating an exemplary position where the wiring is formed for a pad.

Further, in the examples illustrated in FIGS. 3B, 3C, and 3D, part of the region 221 on the contact face is included in the wiring 131. Specifically, the center part of the region 221 on the contact face is included in the wiring 131 in FIG. 3B. The center part of the region 221 on the contact face is included in the end of the wiring 131 in FIG. 3C. Further, half the region 221 on the contact face is included in the wiring 131 in FIG. 3D. Also in this case, if the common material in a plurality of pads 123 is formed at the parts corresponding to the pads 123 in the second layer 13, the bonding performance at the flip-chip bonding parts 100 can be enhanced.

The first embodiment of the present disclosure has been described above.

3. SECOND EMBODIMENT

A second embodiment of the present disclosure will be described below.

Figure 4B:
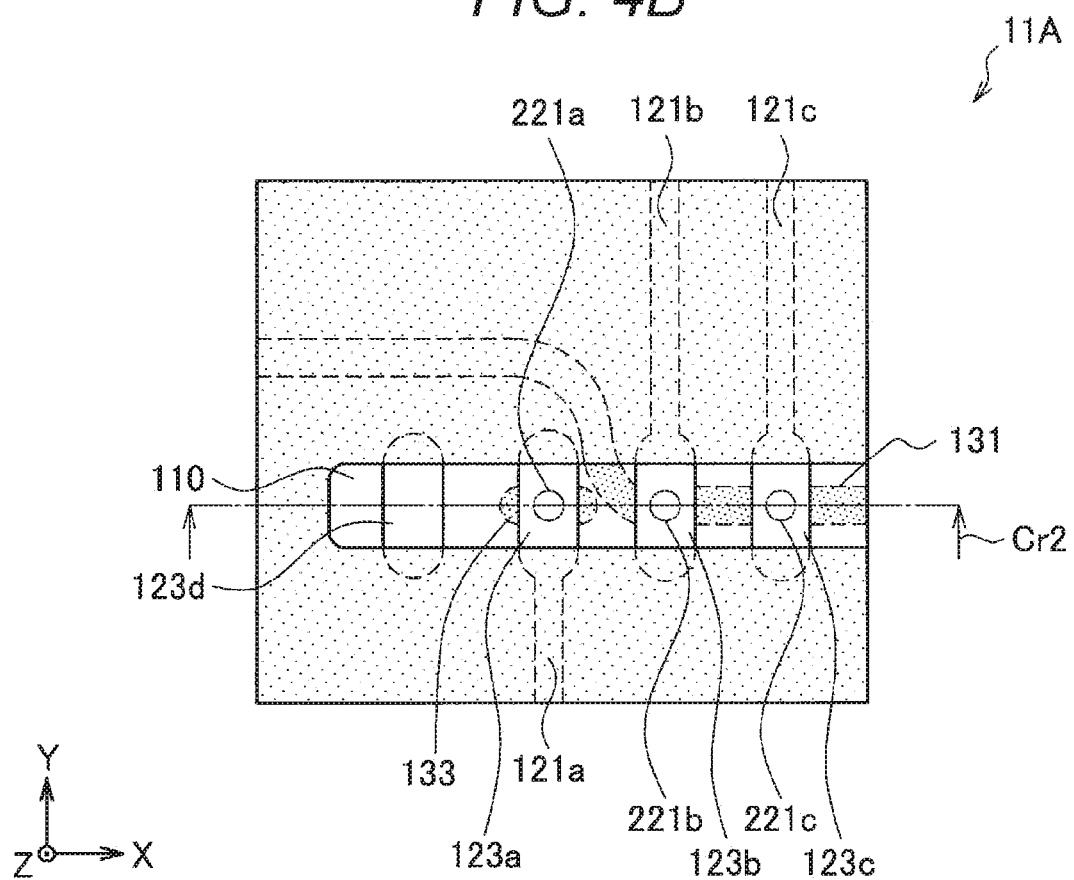
FIG. 4B is a top view illustrating an exemplary configuration of the circuit board at the flip-chip bonding part in the electronic component according to modification corresponding to the second embodiment.

FIG. 4A is a cross-section view illustrating an exemplary configuration of a circuit board 11A at the flip-chip bonding part 100 in the electronic component 10 according to the second embodiment of the present disclosure. Further, FIG. 4B is a top view illustrating an exemplary configuration of the circuit board 11A at the flip-chip bonding part 100. The cross-section view illustrated in FIG. 4A is a side cross-section view along a cut line Cr2 of the top view illustrated in FIG. 4B.

Additionally, the configuration of the first layer 12 in the circuit board 11A illustrated in FIG. 4A is similar to that in the first embodiment. Further, the imaging device (not illustrated) can be provided on the side of the first layer 12 of the circuit board 11A. Further, the pads 123a to 123c illustrated in FIG. 4A and FIG. 4B can be connected to the bumps of the imaging device (not illustrated) on flip-chip mounting.

As illustrated in FIG. 4A and FIG. 4B, a dummy wiring 133, which is a different member from the wiring 131, is formed on the second face 110b of the base material 110 in the second layer 13 in addition to the wiring 131. Specifically, the wiring 131 is formed at the positions corresponding to the pads 123b and 123c, and the dummy wiring 133 is formed at the position corresponding to the pad 123a. The dummy wiring 133 is a different member from the wiring 131 and does not configure the circuit, but can be made of the same material as the wiring 131. In this case, the wiring 131 and the dummy wiring 133 correspond to contacting members.

Further, the resist part 132 is formed to cover the wiring 131 and the dummy wiring 133 on the second face 110b of the base material 110 in the second layer 13.

As illustrated in the example of FIG. 4B, in one exemplary configuration of the present embodiment, the dummy wiring 133 made of the same material as the wiring is provided at the position corresponding to the pad 123a even in a case where the wiring 131 is formed though only the positions corresponding to the pads 123b and 123c. Thereby, the members configuring the grounds in a plurality of pads 123 include the same material. Therefore, the contact pressure when the bumps 22 and the pads 123 are bonded on flip-chip mounting can be constant in a plurality of pads 123. Thereby, the bonding performance at the flip-chip bonding parts 100 can be stabilized irrespective of the positions where the wiring 131 is arranged.

The second embodiment of the present disclosure has been described above.

4. THIRD EMBODIMENT

A third embodiment of the present disclosure will be described below.

Figure 5B:
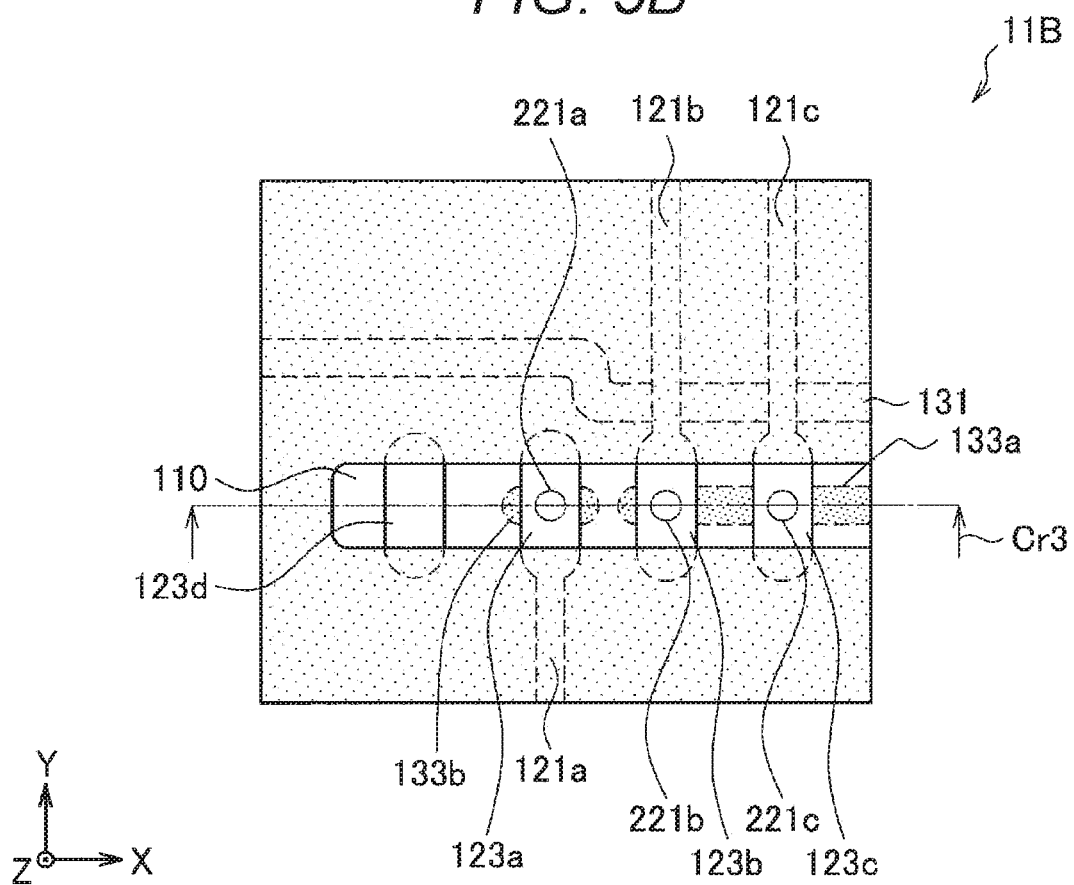
FIG. 5B is a top view illustrating an exemplary configuration of the circuit board at the flip-chip bonding part in the electronic component according to modification corresponding to the third embodiment.

FIG. 5A is a cross-section view illustrating an exemplary configuration of a circuit board 11B at the flip-chip bonding part 100 in the electronic component 10 according to the third embodiment of the present disclosure. Further, FIG. 5B is a top view illustrating an exemplary configuration of the circuit board 11B at the flip-chip bonding part 100. The cross-section view illustrated in FIG. 5A is a side cross-section view along a cut line Cr3 of the top view illustrated in FIG. 5B.

Additionally, the configuration of the first layer 12 in the circuit board 11B illustrated in FIG. 5A is similar to that in the first embodiment. Further, the imaging device (not illustrated) can be formed on the side of the first layer 12 of the circuit board 11B. Further, the pads 123a to 123c illustrated in FIG. 5A and FIG. 5B can be connected to the bumps of the imaging device (not illustrated) on flip-chip mounting.

As illustrated in FIG. 5A and FIG. 5B, pieces of dummy wiring 133a and 133b, which are different members from the wiring 131, are formed on the second face 110b of the base material 110 in the second layer 13 in addition to the wiring 131. Specifically, as illustrated in FIG. 5B, the wiring 131 is arranged so that it does not extend through the positions corresponding to the pads 123. Instead, the pieces of dummy wiring 133a and 133b are formed at the positions corresponding to the pads 123a to 123c. The dummy wiring 133 is different members from the wiring 131 and does not configure the circuit, but can be made of the same material as the wiring 131. In this case, the dummy wiring 133 corresponds to contacting members.

Further, the resist part 132 is formed to cover the wiring 131 and the dummy wiring 133 on the second face 110b of the base material 110 in the second layer 13.

As illustrated in the example of FIG. 5B, the dummy wiring 133 made of the same material as the wiring are provided at the positions corresponding to the respective pads 123 even in a case where the wiring 131 is formed so that it does not extend through the positions corresponding to the pads 123 in one exemplary configuration of the present embodiment. Thereby, the members configuring the grounds include the same material in a plurality of pads 123. Therefore, the contact pressure can be constant in a plurality of pads 123 when the bump 22 and the pads 123 are bonded on flip-chip mounting. Thereby, the bonding performance at the flip-chip bonding parts 100 can be stabilized irrespective of the positions where the wiring 131 is installed.

The third embodiment of the present disclosure has been described above.

5. FOURTH EMBODIMENT

A fourth embodiment of the present disclosure will be described below.

Figure 6A:
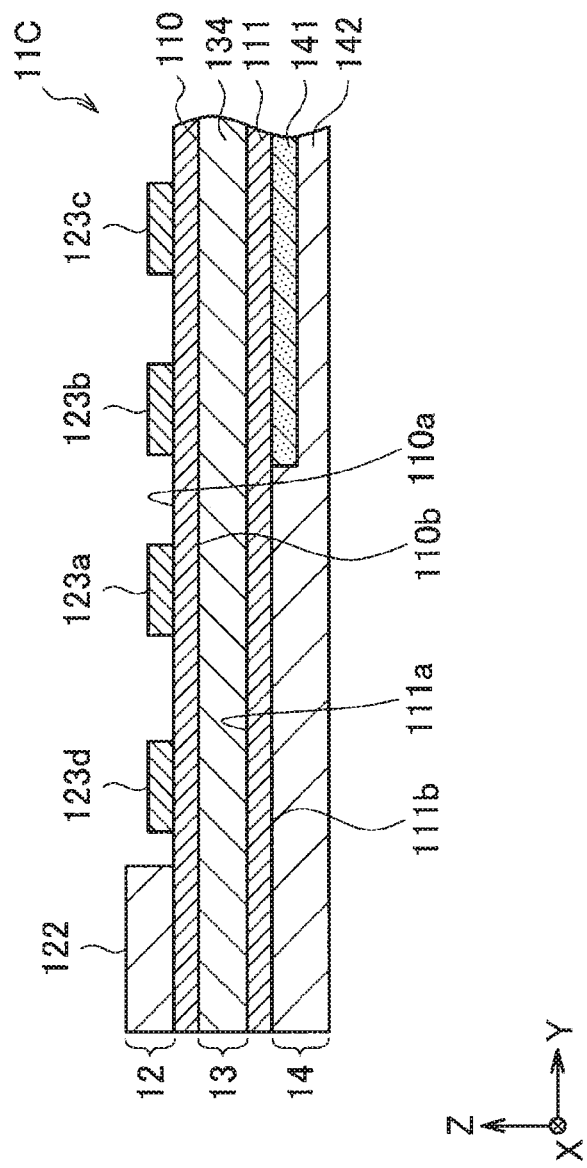
FIG. 6A is a cross-section view illustrating an exemplary configuration of a circuit board at the flip-chip bonding part in the electronic component according to a fourth embodiment of the present disclosure.
Figure 6B:
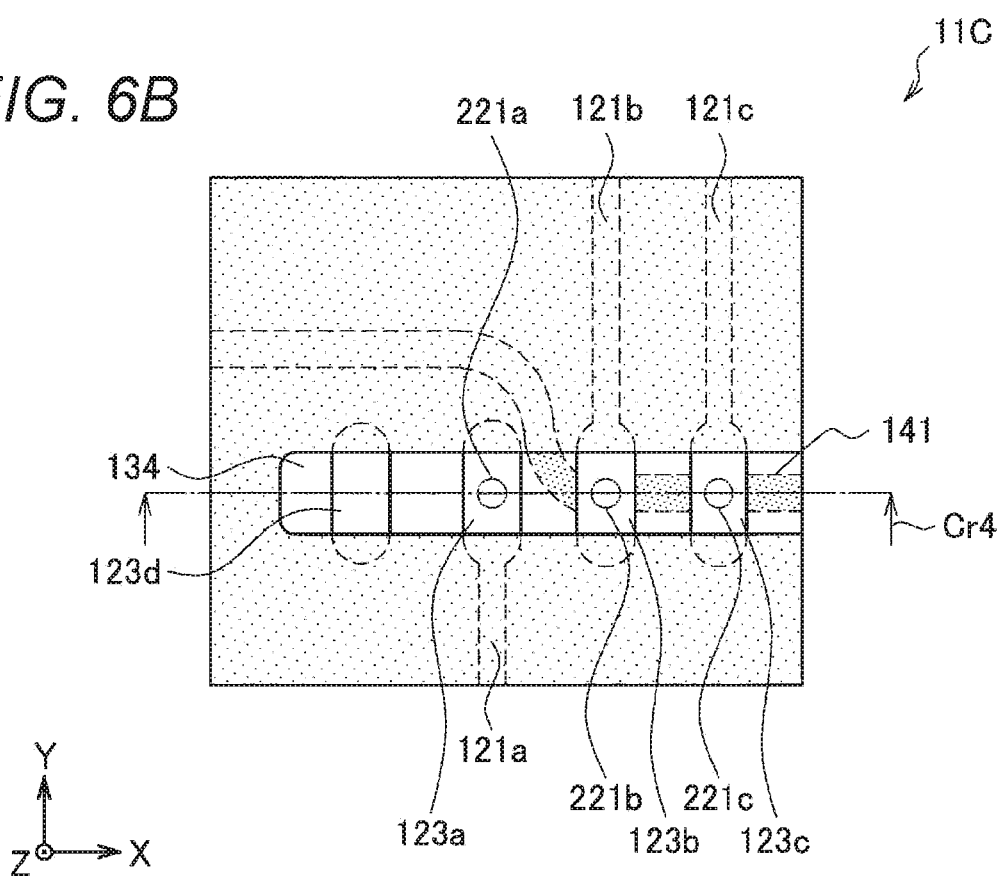
FIG. 6B is a top view illustrating an exemplary configuration of the circuit board at the flip-chip bonding part in the electronic component according to modification corresponding to the fourth embodiment.

FIG. 6A is a cross-section view illustrating an exemplary configuration of a circuit board 11C at the flip-chip bonding part 100 in the electronic component 10 according to the fourth embodiment of the present disclosure. Further, FIG. 6B is a top view illustrating an exemplary configuration of the circuit board 11C at the flip-chip bonding part 100. The cross-section view illustrated in FIG. 6A is a side cross-section view along a cut line Cr4 of the top view illustrated in FIG. 6B.

Additionally, the configurations of the base material 110 and abase material 111 are omitted from FIG. 6B for description. Further, the imaging device (not illustrated) can be provided on the side of the first layer 12 of the circuit board 11C. Further, the pads 123a to 123c illustrated in FIG. 6A and FIG. 6B can be connected to the bumps of the imaging device (not illustrated) on flip-chip mounting.

As illustrated in FIG. 6A, the circuit board 11C according to the present embodiment includes a third layer 14 in addition to the first layer 12 and the second layer 13. The first layer 12 is on the side of the first face 110a of the base material 110 (corresponding to a first base material). The second layer 13 is sandwiched between the second face 110b of the base material 110 and a first face 111a of the base material 111 (corresponding to a second base material). The first face 111a of the base material 111 opposes the imaging device 21, or is on the surface layer side. The third layer 14 is on the side of the second face 111b of the base material 111, and is inwardly deeper than the second layer 13. Additionally, the second face 111b of the base material 111 is opposite to the first face 111a. Additionally, the materials of the base material 110 and the base material 111 are not particularly limited.

The configuration of the first layer 12 is similar to that in the first embodiment of the present disclosure, and thus the description thereof will be omitted. Further, the pads 123a to 123c illustrated in FIG. 6A can be connected to the bumps of the imaging device (not illustrated) on flip-chip mounting.

The second layer 13 is provided with a buffer member 134. The second layer 13 corresponds to a buffer layer. In the example illustrated in FIG. 6B, the buffer member 134 contacts with the second face 110b of the base material 110 and is formed over the entire second layer 13. That is, the buffer member 134 corresponds to contacting members provided at the positions corresponding to the pads 123a to 123c. The buffer member 134 can be made of a single material. The kinds of materials are not particularly limited. For example, the material may be the same as the material making the wiring or the resist part.

Wiring 141 is formed in the third layer 14. As illustrated in FIG. 6A, the wiring 141 is formed on the side of the second face 111b of the base material 111 in the third layer 14. Further, as illustrated in FIG. 6B, the wiring 141 is formed through the positions corresponding to the pads 123b and 123c in plan view. Further, a resist part 142 can be formed to cover the wiring 141.

As illustrated in the example of FIG. 6A and FIG. 6B, the buffer member 134 is provided over the second layer 13 in one exemplary configuration of the present embodiment. Thereby, the members configuring the grounds include the same material in a plurality of pads 123. Thus, the contact pressure can be constant in a plurality of pads 123 when the bumps 22 and the pads 123 are bonded on flip-chip mounting. Therefore, the bonding performance at the flip-chip bonding parts 100 can be stabilized irrespective of the positions where the wiring 141 is installed.

The fourth embodiment of the present disclosure has been described above.

6. FIFTH EMBODIMENT

A fifth embodiment of the present disclosure will be described below.

Figure 7:
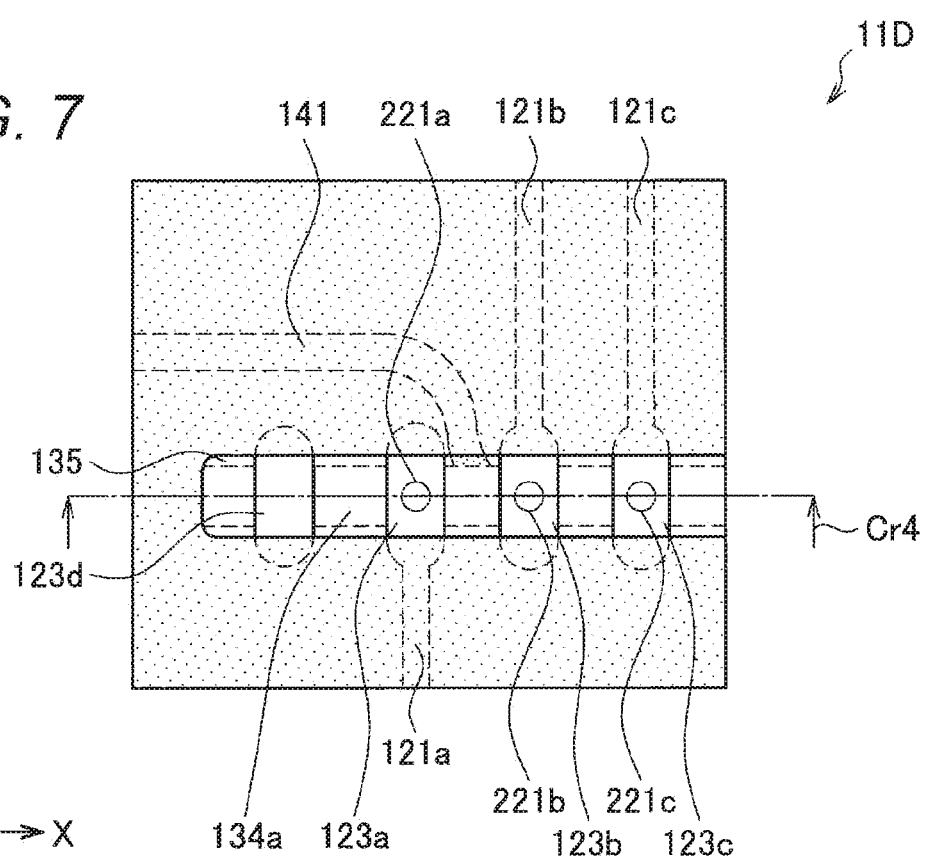
FIG. 7 is a top view illustrating an exemplary configuration of a circuit board at the flip-chip bonding part in the electronic component according to a fifth embodiment of the present disclosure.

FIG. 7 is a top view illustrating an exemplary configuration of a circuit board 11D at the flip-chip bonding part 100 in the electronic component 10 according to the fifth embodiment of the present disclosure. Additionally, a cross-section view illustrating an exemplary configuration of the circuit board 11D at the flip-chip bonding part 100 is the same as the cross-section view illustrating an exemplary configuration of the circuit board 11C illustrated in FIG. 6A. Thus, FIG. 6A is used for describing the present embodiment.

Further, the configurations of the base material 110 and the base material 111 are omitted from FIG. 7 for description. Further, the imaging device (not illustrated) can be provided on the side of the first layer 12 of the circuit board 11D. Further, the pads 123a to 123c illustrated in FIG. 7 can be connected to the bumps of the imaging device (not illustrated) on flip-chip mounting.

According to the present embodiment, a buffer member 134a may be transversely provided over the pads 123a to 123c in the second layer 13 (buffer layer) as illustrated in FIG. 7. In this case, the buffer member 134a corresponds to contacting members provided at the positions corresponding to the pads 123a to 123c. Additionally, a resist part 135 may be formed by a resist member, for example, at a part where the buffer member 134a is not provided in the second layer 13.

As illustrated in FIG. 6A, the wiring 141 according to the present embodiment is formed on the side of the second face 111b of the base material 111 in the third layer 14. Further, as illustrate in FIG. 7, the wiring 141 is formed through the positions corresponding to the pads 123b and 123c in plan view. Further, the resist part 142 can be formed to cover the wiring 141.

As illustrated in the example of FIG. 6A and FIG. 7, the buffer member 134a is provided to extend in a direction in which the pads 123a to 123c are arranged side by side in one exemplary configuration of the present embodiment. Thereby, the members configuring the grounds include the same material in a plurality of pads 123. Thus, the contact pressure can be constant in a plurality of pads 123 when the bumps 22 and the pads 123 are bonded on flip-chip mounting. Therefore, the bonding performance at the flip-chip bonding parts 100 can be stabilized irrespective of the positions where the wiring 141 is installed.

A variant of the present embodiment will be described below.

Figure 8A:
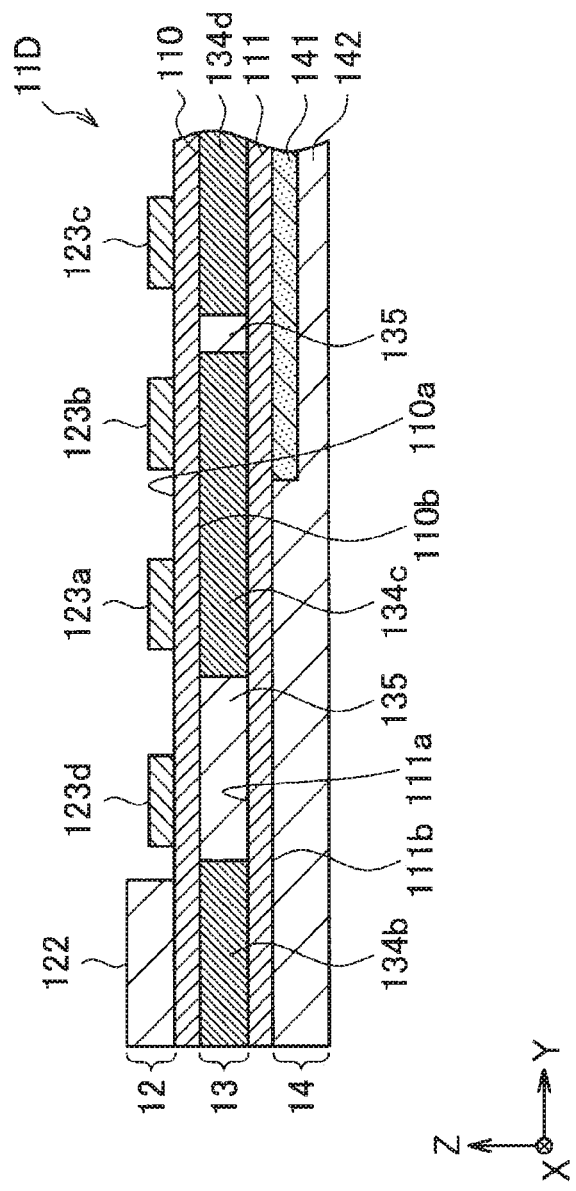
FIG. 8A is a cross-section view illustrating an exemplary configuration of the circuit board at the flip-chip bonding part in the electronic component according to a variant of the fifth embodiment.
Figure 8B:
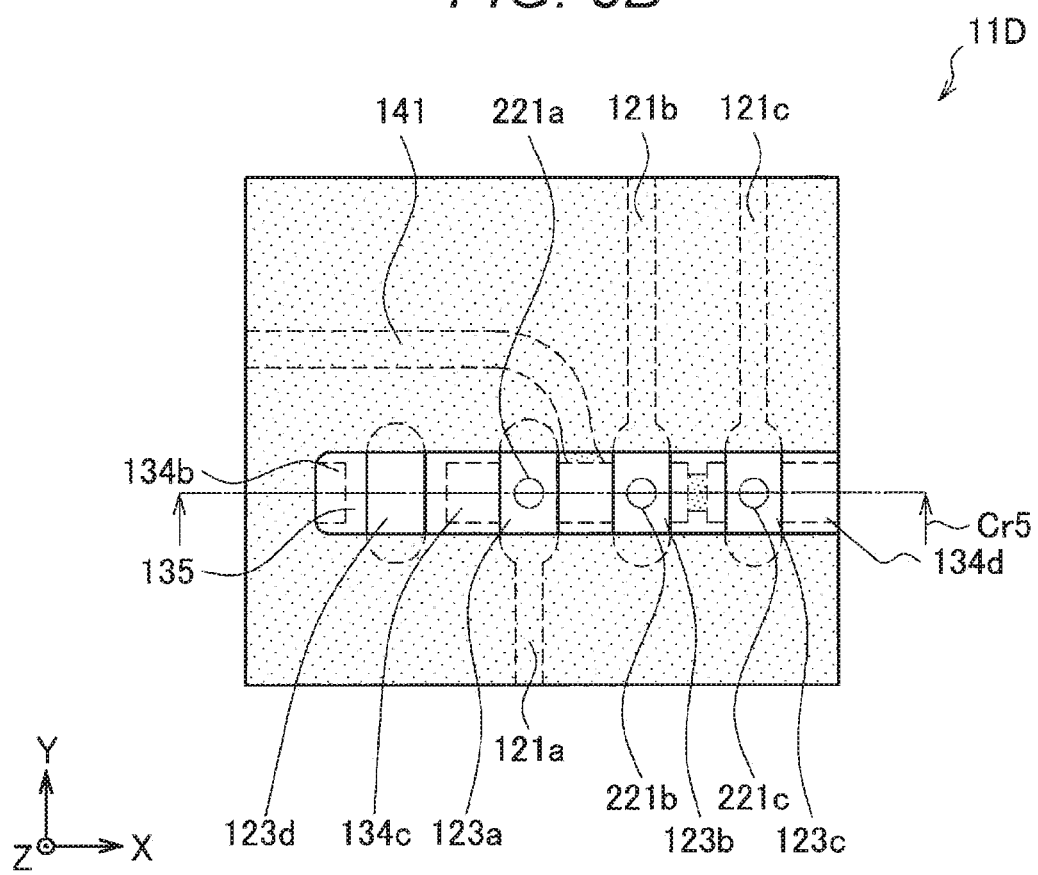
FIG. 8B is a top view illustrating an exemplary configuration of the circuit board at the flip-chip bonding part in the electronic component according to the variant of the fifth embodiment.

FIG. 8A is a cross-section view illustrating an exemplary configuration of the circuit board 11D at the flip-chip bonding part 100 in the electronic component 10 according to a variant of the fifth embodiment of the present disclosure. Further, FIG. 8B is a top view illustrating an exemplary configuration of the circuit board 11D at the flip-chip bonding part 100 in the electronic component 10 according to the present variant. The cross-section view illustrated in FIG. 8A is a side cross-section view along a cut line Cr7 of the top view illustrated in FIG. 8B.

Additionally, the configurations of the base material 110 and the base material 111 are omitted from FIG. 8B for description. Further, the imaging device (not illustrated) can be provided on the side of the first layer 12 of the circuit board 11D. Further, the pads 123a to 123c illustrated in FIG. 8A and FIG. 8B can be connected to the bumps of the imaging device (not illustrated) on flip-chip mounting.

As illustrated in FIG. 8A and FIG. 8B, the buffer member 134 provided as a buffer layer in the second layer 13 may be discontinuously arranged in a direction in which the pads 123 are arranged side by side. In the example illustrated in FIG. 8A and FIG. 8B, buffer members 134b to 134d are arranged in the second layer 13 in the direction in which the pads 123a to 123c are arranged side by side. Further, the buffer member 134c is provided at the positions corresponding to the pads 123a and 123b, and the buffer member 134d is provided at the position corresponding to the pad 123c. Additionally, the pad 123d is not bonded to a bump 22, and thus a buffer member 134 may not be provided at the position corresponding to the pad 123d.

Also in this case, the members configuring the grounds include the same material in a plurality of pads 123 as described above. Thus, the contact pressure can be constant in a plurality of pads 123 when the bumps 22 and the pads 123 are bonded on flip-chip mounting. Thereby, the bonding performance at the flip-chip bonding parts 100 can be stabilized irrespective of the positions where the wiring 141 is installed.

The fifth embodiment of the present disclosure has been described above.

7. SIXTH EMBODIMENT

A sixth embodiment of the present disclosure will be described below.

Figure 9B:
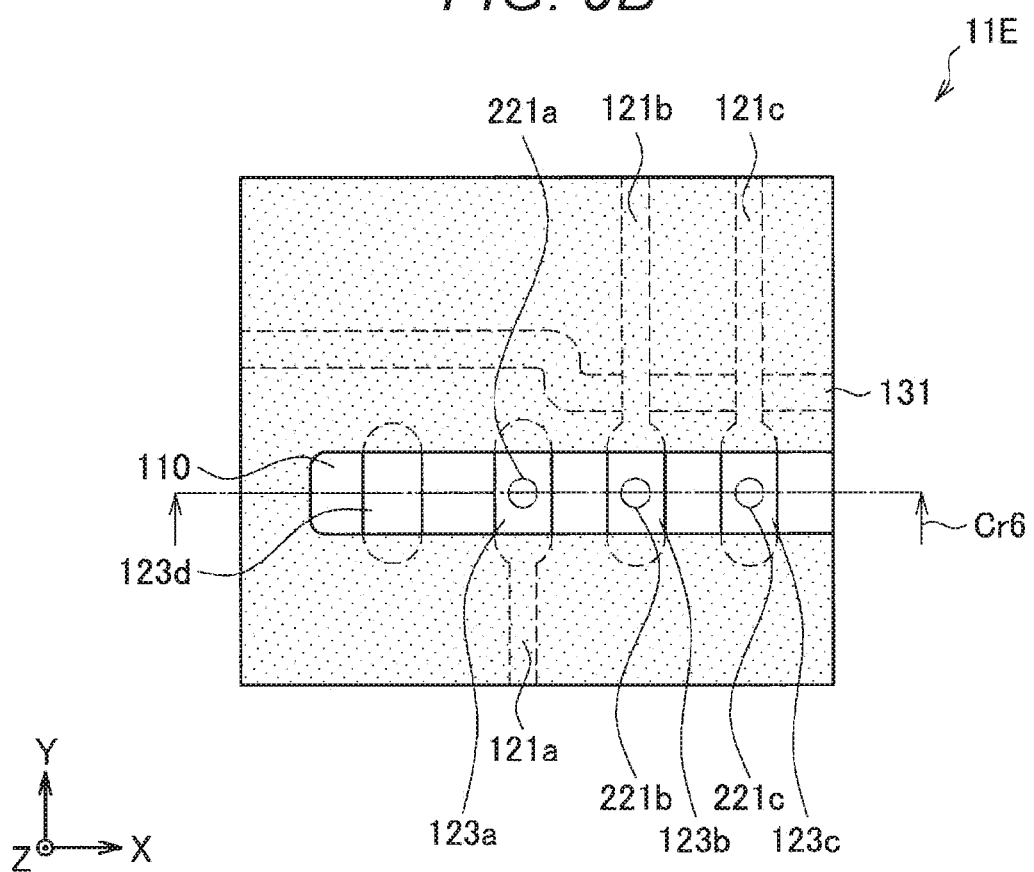
FIG. 9B is a top view illustrating an exemplary configuration of the circuit board at the flip-chip bonding part in the electronic component according to modification corresponding to the sixth embodiment.

FIG. 9A is a cross-section view illustrating an exemplary configuration of a circuit board 11E at the flip-chip bonding part 100 in the electronic component 10 according to the sixth embodiment of the present disclosure. Further, FIG. 9B is a top view illustrating an exemplary configuration of the circuit board 11E at the flip-chip bonding part 100. The cross-section view illustrated in FIG. 9A is a side cross-section view along a cut line Cr6 of the top view illustrated in FIG. 9B.

Additionally, the imaging device (not illustrated) can be provided on the side of the first layer 12 of the circuit board 11E. Further, the pads 123a to 123c illustrated in FIG. 9A and FIG. 9B can be connected to the bumps of the imaging device (not illustrated) on flip-chip mounting.

As illustrated in FIG. 9A and FIG. 9B, the wiring 131 is formed on the second face 110b of the base material 110 in the second layer 13. Specifically, the wiring 131 is formed at a position other than the positions corresponding to the pads 123a to 123c. Further, as illustrated in FIG. 9A, the resist part 132 is formed to cover the wiring 131 on the second face 110b of the base material 110 in the second layer 13. In this case, the resist member forming the resist part 132 corresponds to a contacting member.

In one exemplary configuration of the present embodiment, even in a case where the wiring 131 is formed through a position other than the positions corresponding to the pads 123a to 123c, the resist part 132 including a resist member is provided at the positions corresponding to the respective pads 123 as illustrated in FIG. 9A. Thereby, the members configuring the grounds include the same material in a plurality of pads 123. Thus, the contact pressure can be constant in a plurality of pads 123 when the bumps 22 and the pads 123 are bonded on flip-chip mounting. Therefore, the bonding performance at the flip-chip bonding parts 100 can be stabilized irrespective of the positions where the wiring 131 is arranged.

The sixth embodiment of the present disclosure has been described above.

8. SEVENTH EMBODIMENT

A seventh embodiment of the present disclosure will be described below.

FIG. 10 is a cross-section view illustrating an exemplary configuration of a circuit board 11F at the flip-chip bonding part 100 in the electronic component 10 according to the seventh embodiment of the present disclosure. Additionally, the wiring 131 in FIG. 10 is formed on the second face 110b of the base material 110 at the positions corresponding to the pads 123b and 123c in the second layer 13. Further, the imaging device (not illustrated) can be provided on the side of the first layer 12 of the circuit board 11F. Further, the pads 123a to 123c illustrated in FIG. 10 can be connected to the bumps of the imaging device (not illustrated) on flip-chip mounting.

As illustrated in FIG. 10, a reinforcement part 136 is formed to cover the wiring 131 in the second layer 13 of the circuit board 11F according to the present embodiment. Part of the reinforcement part 136 contacts with the second face 110b of the base material 110 at the position corresponding to the pad 123a in the second layer 13. Therefore, the reinforcement part 136 and the wiring 131 correspond to contacting members.

At this time, the reinforcement part 136 is made of a different material from the wiring 131, but can have as high a degree of elasticity as the wiring 131. Thereby, the members configuring the grounds have the same degree of elasticity in a plurality of pads 123. Thus, the mechanical behaviors are similar in a plurality of pads 123 when the bumps 22 and the pads 123 are pressed against each other on flip-chip mounting. That is, the contact pressure can be constant in a plurality of pads 123 when the bumps 22 and the pads 123 are bonded. Thereby, the bonding performance at the flip-chip-bonding parts 100 can be stabilized irrespective of the positions where the wiring 131 is arranged.

The reinforcement part 136 may be made of resin or the like having as high a degree of elasticity as the material making the wiring 131, for example. Additionally, the resist part 122 may be made of the same material as the reinforcement part 136, for example.

The eighth embodiment of the present disclosure has been described above.

9. APPLICATION TO IN-VIVO INFORMATION ACQUISITION SYSTEM

The technology according to the present disclosure (the present technology) can be applied to various products. For example, the technology according to the present disclosure may be applied to an endoscopic surgery system.

Figure 11:
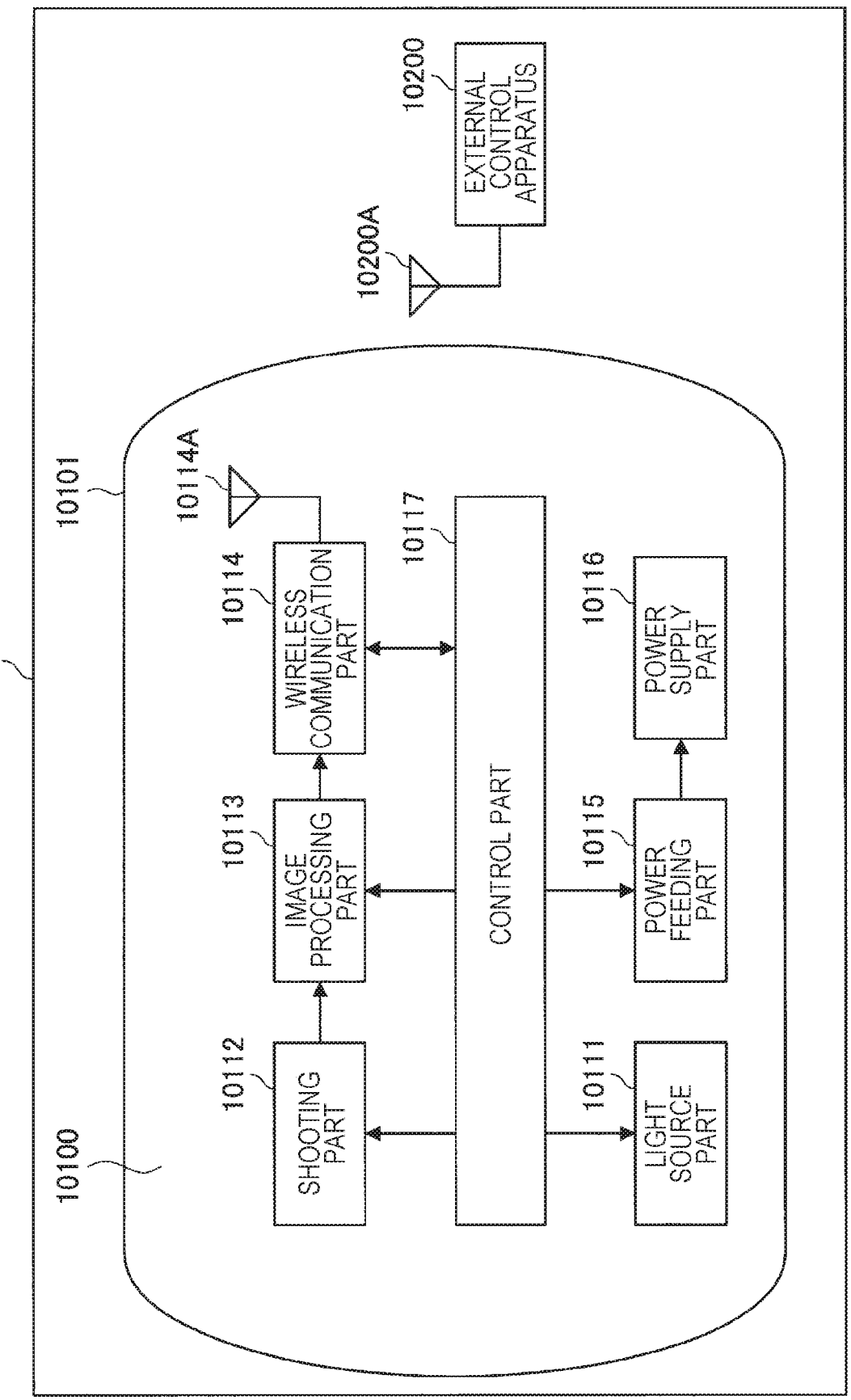
FIG. 11 is a block diagram illustrating an exemplary schematic configuration of an in-vivo information acquisition system.

FIG. 11 is a block diagram illustrating an exemplary schematic configuration of a patient's in-vivo information acquisition system by use of a capsule endoscope to which the technology according to the present disclosure (the present technology) is applicable.

An in-vivo information acquisition system 10001 is configured of a capsule endoscope 10100 and an external control apparatus 10200.

The capsule endoscope 10100 is swallowed by a patient on examination. The capsule endoscope 10100 has a shooting function and a wireless communication function, and sequentially shoots images of the inside of organs (also denoted as in-vivo image) at predetermined intervals and sequentially and wirelessly transmits the information indicating the in-vivo images to the external control apparatus 10200 outside the body while moving through the organs such as stomach and intestines by peristalsis or the like until it is naturally expelled from the patient.

The external control apparatus 10200 totally controls the operations of the in-vivo information acquisition system 10001. Further, the external control apparatus 10200 receives the information indicating the in-vivo images transmitted from the capsule endoscope 10100, and generates image data for displaying the in-vivo images on a display apparatus (not illustrated) on the basis of the received information indicating the in-vivo images.

The in-vivo information acquisition system 10001 can acquire the in-vivo images shooting the inside of the patient's body as needed in this way until the capsule endoscope 10100 is expelled after it is swallowed.

The configurations and functions of the capsule endoscope 10100 and the external control apparatus 10200 will be described in more detail.

The capsule endoscope 10100 includes a capsule casing 10101, and the casing 10101 houses a light source part 10111, a shooting part 10112, an image processing part 10113, a wireless communication part 10114, a power feeding part 10115, a power supply part 10116, and a control part 10117 therein.

The light source part 10111 is configured of, for example, a light source such as light emitting diode (LED), and irradiates a shooting field of the shooting part 10112 with light.

The shooting part 10112 is configured of an optical system including an imaging device and a plurality of lenses provided in front of the imaging device. Reflected light of light (denoted as observation light below) with which a body tissue as an object to be observed is irradiated is collected by the optical system and enters the imaging device. The observation light entering the imaging device is photoelectrically converted and an image signal corresponding to the observation light is generated in the shooting part 10112. The image signal generated by the shooting part 10112 is provided to the image processing part 10113.

The image processing part 10113 is configured of a processor such as central processing unit (CPU) or graphics processing unit (GPU), and performs various signal processing on the image signal generated by the shooting part 10112. The image processing part 10113 provides the image signal subjected to a signal processing as RAW data to the wireless communication part 10114.

The wireless communication part 10114 performs a predetermined processing such as modulation processing on the image signal subjected to the signal processing by the image processing part 10113, and transmits the image signal to the external control apparatus 10200 via an antenna 10114A. Further, the wireless communication part 10114 receives a control signal for driving and controlling the capsule endoscope 10100 from the external control apparatus 10200 via the antenna 10114A. The wireless communication part 10114 provides the control signal received from the external control apparatus 10200 to the control part 10117.

The power feeding part 10115 is configured of a power reception antenna coil, a power regeneration circuit for regenerating power from a current generated in the antenna coil, a booster circuit, and the like. The power feeding part 10115 generates power by use of the non-contact charging principle.

The power supply part 10116 is configured of a secondary battery, and accumulates power generated by the power feeding part 10115. The arrows and the like indicating the destinations of power supplied from the power supply part 10116 are omitted in FIG. 11 in order to avoid the complicated diagram, but the power accumulated in the power supply part 10116 is supplied to the light source part 10111, the shooting part 10112, the image processing part 10113, the wireless communication part 10114, and the control part 10117, and is used to drive the parts.

The control part 10117 is configured of a processor such as CPU, and controls driving the light source part 10111, the shooting part 10112, the image processing part 10113, the wireless communication part 10114, and the power feeding part 10115 as needed according to a control signal transmitted from the external control apparatus 10200.

The external control apparatus 10200 is configured of a processor such as CPU or GPU, a microcomputer on which storage devices such as processor and memory are mounted together, a control board, or the like. The external control apparatus 10200 transmits a control signal to the control part 10117 in the capsule endoscope 10100 via an antenna 10200A, thereby controlling the operations of the capsule endoscope 10100. For example, the conditions for irradiating an object to be observed in the light source part 10111 with light can be changed by a control signal from the external control apparatus 10200 in the capsule endoscope 10100. Further, the shooting conditions (such as frame rate and exposure value in the shooting part 10112, for example) can be changed by a control signal from the external control apparatus 10200. Further, the processing contents in the image processing part 10113 and the conditions (such as transmission interval and number of images to be transmitted, for example) for transmitting an image signal in the wireless communication part 10114 may be changed by a control signal from the external control apparatus 10200.

Further, the external control apparatus 10200 performs various image processing on the image signal transmitted from the capsule endoscope 10100, and generates image data for displaying the shot in-vivo images on the display apparatus. For the image processing, various signal processing such as development processing (demosaic processing), image quality increase processing (bandwidth emphasis processing, super-resolution processing, noise reduction (NR) processing and/or blurring correction processing, for example), and/or enlargement processing (electronic zooming processing) can be performed, for example. The external control apparatus 10200 controls driving the display apparatus, and causes it to display the shot in-vivo images on the basis of the generated image data. Alternatively, the external control apparatus 10200 may cause a recording apparatus (not illustrated) to record the generated image data or may cause a printing apparatus (not illustrated) to print out the generated image data.

An exemplary in-vivo information acquisition system to which the technology according to the present disclosure is applicable has been described above. The technology according to the present disclosure is applicable to the shooting part 10112 in the above-described constituents. Specifically, the camera module 1 according to each embodiment described above can be applied to the shooting part

10112. The technology according to the present disclosure is applied to the shooting part 10112, and thus the shooting part 10112 can be stably used for a long time.

10. APPLICATION TO ENDOSCOPIC SURGERY SYSTEM

Further, the technology according to the present disclosure (the present technology) is applicable to various products. For example, the technology according to the present disclosure may be applied to an endoscopic surgery system.

Figure 12:
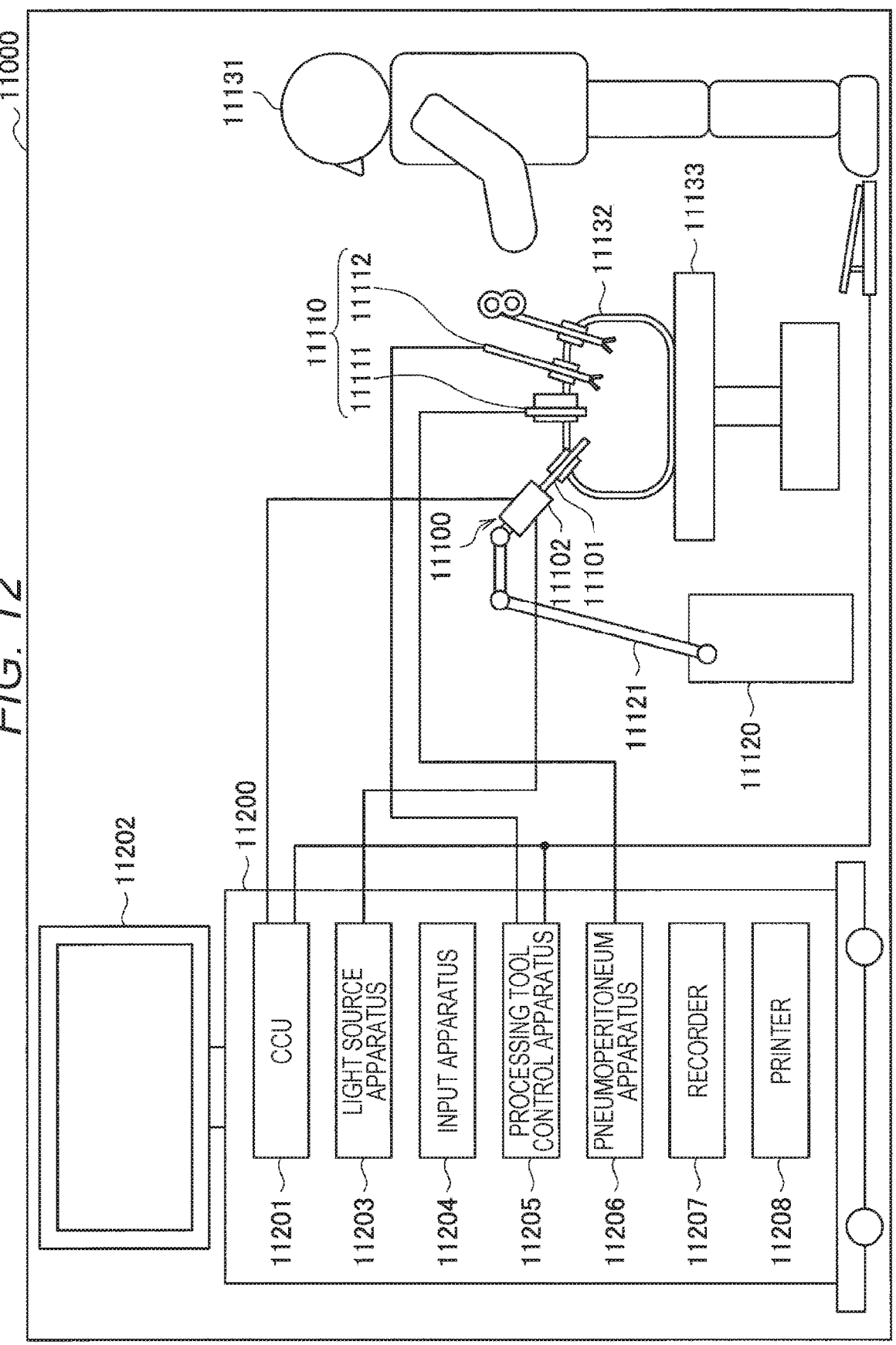
FIG. 12 is a diagram illustrating an exemplary schematic configuration of an endoscopic surgery system.

FIG. 12 is a diagram illustrating an exemplary schematic configuration of an endoscopic surgery system to which the technology according to the present disclosure (the present technology) can be applied.

FIG. 12 illustrates how an operator (doctor) 11131 performs an operation on a patient 11132 on a patient's bed 11133 by use of an endoscopic surgery system 11000. As illustrated, the endoscopic surgery system 11000 is configured of an endoscope 11100, the other surgical instruments 11110 such as pneumoperitoneum tube 11111 and energy treatment tool 11112, a support arm apparatus 11120 for supporting the endoscope 11100, and a cart 11200 on which various apparatuses for endoscopic surgery are mounted.

The endoscope 11100 is configured of a lens tube 11101 the region of which at a predetermined length from the tip is inserted into the body cavity of the patient 11132, and a camera head 11102 connected to the base of the lens tube 11101. In the illustrated example, the endoscope 11100 configured as a rigid scope having the hard lens tube 11101 is illustrated, but the endoscope 11100 may be configured as a flexible scope having a flexible lens tube.

An opening with an objective lens fitted is provided at the tip of the lens tube 11101. A light source apparatus 11203 is connected to the endoscope 11100, and light generated by the light source apparatus 11203 is guided to the tip of the lens tube by a light guide extending into the lens tube 11101, and is applied toward an object to be observed in the body cavity of the patient 11132 via the objective lens. Additionally, the endoscope 11100 may be a direct-viewing lens, or may be an oblique-viewing lens or side-viewing lens.

An optical system and an imaging device are provided inside the camera head 11102, and reflected light (observation light) from an object to be observed is condensed on the imaging device via the optical system. The observation light is photoelectrically converted by the imaging device, and an electric signal corresponding to the observation light, or an image signal corresponding to the observed image is generated. The image signal is transmitted as RAW data to a camera control unit (CCU) 11201.

The CCU 11201 is configured of a central processing unit (CPU), a graphics processing unit (GPU), or the like, and totally controls the operations of the endoscope 11100 and a display apparatus 11202. Further, the CCU 11201 receives an image signal from the camera head 11102, and performs various image processing for displaying an image based on the image signal, such as development processing (demosaic processing), for example, on the image signal.

The display apparatus 11202 displays the image based on the image signal subjected to the image processing by the CCU 11201 under control of the CCU 11201.

The light source apparatus 11203 is configured of, for example, a light source such as light emitting diode (LED), and supplies irradiation light to the endoscope 11100 when shooting a surgical site or the like.

An input apparatus 11204 is an input interface for the endoscopic surgery system 11000. A user can input various items of information or instructions into the endoscopic surgery system 11000 via the input apparatus 11204. For example, the user inputs an instruction to change shooting conditions (such as kind of irradiation light, magnification, and focal distance) of the endoscope 11100 or the like.

A processing tool control apparatus 11205 controls to drive the energy treatment tool 11112 for cauterizing or cutting a tissue, sealing a blood vessel, and the like. A pneumoperitoneum apparatus 11206 feeds gas into the body cavity via the pneumoperitoneum tube 11111 to expand the body cavity of the patient 11132 in order to secure the field of view of the endoscope 11100 and to secure a working space of the operator. A recorder 11207 is an apparatus capable of recording various items of information regarding a surgery. A printer 11208 is an apparatus capable of printing various items of information regarding a surgery in various forms such as text, image, or graph.

Additionally, the light source apparatus 11203 for supplying irradiation light to the endoscope 11100 when shooting a surgical site can be configured of a white light source made of an LED, a laser light source, or a combination thereof, for example. In a case where the white light source is configured in a combination of RGB laser light sources, the output intensity and the output timing of each color (each wavelength) can be controlled with high accuracy, and thus the white balance of a shot image can be adjusted in the light source apparatus 11203. Further, in this case, an object to be observed is irradiated with beams of laser light from the respective RGB laser light sources in a time division manner, and the imaging device in the camera head 11102 is controlled to be driven in synchronization with the irradiation timings, thereby shooting the images corresponding to RGB in a time division manner. According to the method, a color image can be obtained without a color filter in the imaging device.

Further, the light source apparatus 11203 may be controlled to be driven for changing the intensity of light to be output at a predetermined time. The imaging device in the camera head 11102 is controlled to be driven in synchronization with the timings to change the intensities of the beams of light thereby to obtain images in a time division manner, and the images are combined thereby to generate an image with a high dynamic range without blocked-up shadows and blown-out highlights.

Further, the light source apparatus 11203 may be configured to supply light in a predetermined wavelength band corresponding to special light observation. Under the special light observation, for example, light in a narrower band than irradiation light (or white light) during normal observation is applied by use of the wavelength dependency of absorption of light in a body tissue, thereby performing narrow band imaging for shooting a predetermined tissue such as blood vessel in the superficial portion of the mucous membrane at high contrast. Alternatively, under the special light observation, fluorescent observation for obtaining an image by fluorescence caused by irradiation of excitation light may be performed. Under the fluorescent observation, a body tissue can be irradiated with excitation light thereby to observe fluorescence from the body tissue (autofluorescence observation), a reagent such as indocyanine green (ICG) can be locally injected into a body tissue, and the body tissue can be irradiated with excitation light corresponding to the fluorescent wavelength of the reagent thereby to obtain a fluorescent image, for example. The light source apparatus 11203 can be configured to supply a narrowband light and/or excitation light corresponding to the special light observation.

Figure 13:
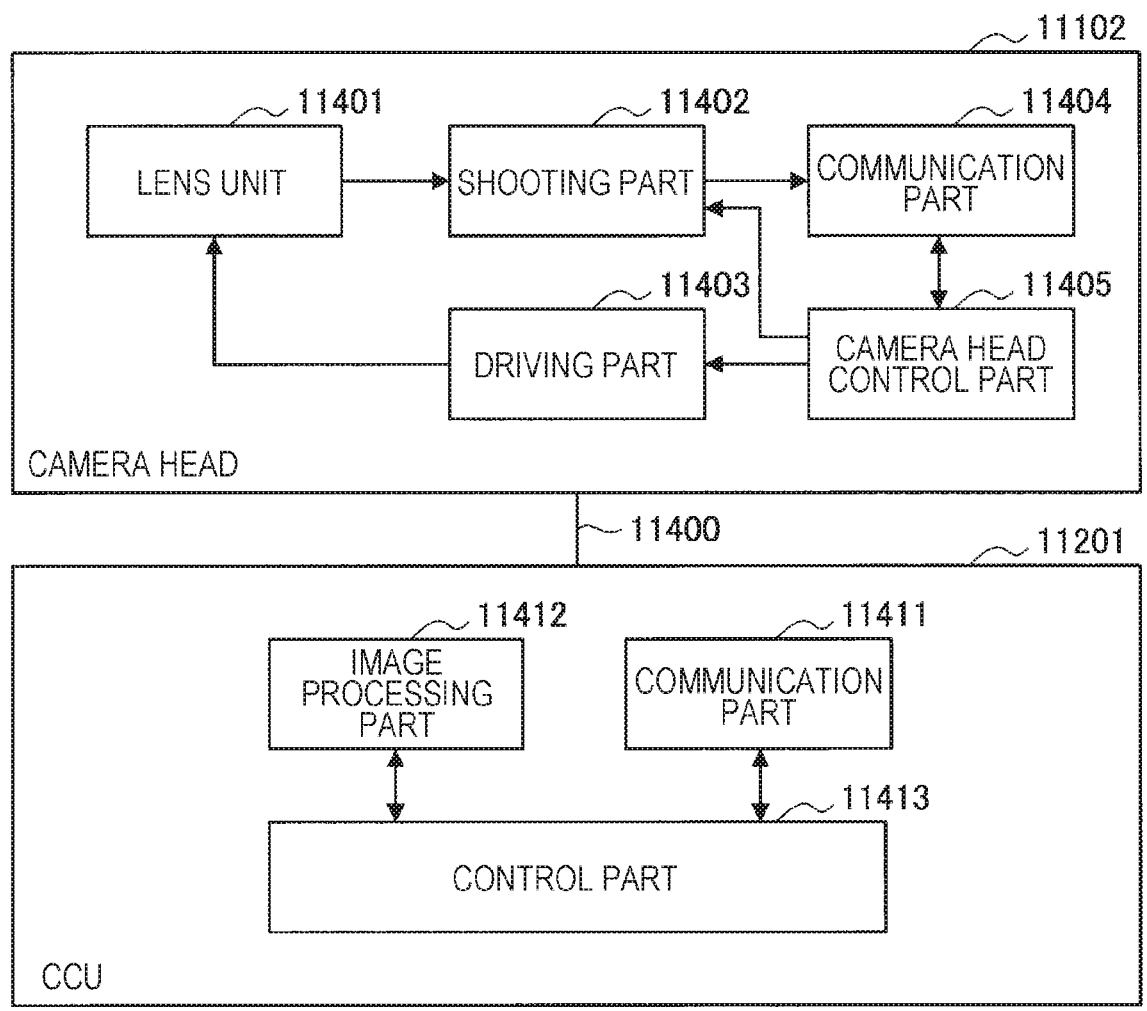
FIG. 13 is a block diagram illustrating an exemplary functional configuration of a camera head and a CCU.

FIG. 13 is a block diagram illustrating an exemplary functional configuration of the camera head 11102 and the CCU 11201 illustrated in FIG. 12.

The camera head 11102 has a lens unit 11401, a shooting part 11402, a driving part 11403, a communication part 11404, and a camera head control part 11405. The CCU 11201 has a communication part 11411, an image processing part 11412, and a control part 11413. The camera head 11102 and the CCU 11201 are communicably connected to each other via a transmission cable 11400.

The lens unit 11401 is an optical system provided at the connection part to the lens tube 11101. An observation light taken from the tip of the lens tube 11101 is guided to the camera head 11102, and is incident into the lens unit 11401. The lens unit 11401 is configured in a combination of a plurality of lenses including a zoom lens and a focus lens.

The shooting part 11402 is configured of an imaging device. One imaging device (or single plate) or a plurality of imaging devices (or multiplate) may configure the shooting part 11402. In a case where the shooting part 11402 is configured in multiplate, the image signals corresponding to RGB may be generated by the imaging devices, respectively, and combined thereby to obtain a color image, for example. Alternatively, the shooting part 11402 may have a pair of imaging devices for obtaining right-eye and left-eye image signals for 3 dimensional (D) display. 3D display is performed so that the operator 11131 can more accurately grasp the depth of a body tissue at a surgical site. Additionally, in a case where the shooting part 11402 is configured in multiplate, a plurality of lens units 11401 corresponding to the imaging devices can be provided, respectively.

Further, the shooting part 11402 may not necessarily be provided in the camera head 11102. For example, the shooting part 11402 may be provided immediately behind the objective lens inside the lens tube 11101.

The driving part 11403 is configured of an actuator, and moves the zoom lens and the focus lens in the lens unit 11401 by a predetermined distance along the optical axis under control of the camera head control part 11405. Thereby, the magnification and the focal point of an image shot by the shooting part 11402 can be adjusted as needed.

The communication part 11404 is configured of a communication apparatus for exchanging various items of information with the CCU 11201. The communication part 11404 transmits an image signal obtained from the shooting part 11402 as RAW data to the CCU 11201 via the transmission cable 11400.

Further, the communication part 11404 receives a control signal for controlling to drive the camera head 11102 from the CCU 11201, and supplies it to the camera head control part 11405. The control signal includes information for designating a frame rate of a shot image, information for designating an exposure value on shooting, and/or information for designating the magnification and the focal point of a shot image and the like, for example.

Additionally, the shooting conditions such as frame rate, exposure value, magnification, and focal point may be designated by the user as needed, or may be automatically set by the control part 11413 in the CCU 11201 on the basis of the obtained image signal. In the latter case, the auto exposure (AE) function, the auto focus (AF) function, and the auto white balance (AWB) function are mounted on the endoscope 11100.

The camera head control part 11405 controls to drive the camera head 11102 on the basis of the control signal from the CCU 11201 received via the communication part 11404.

The communication part 11411 is configured of a communication apparatus for exchanging various items of information with the camera head 11102. The communication part 11411 receives an image signal transmitted from the camera head 11102 via the transmission cable 11400.

Further, the communication part 11411 transmits the control signal for controlling to drive the camera head 11102 to the camera head 11102. The image signal or control signal can be transmitted via electric communication, optical communication, or the like.

The image processing part 11412 performs various image processing on the image signal as RAW data transmitted from the camera head 11102.

The control part 11413 performs various controls for shooting a surgical site or the like by the endoscope 11100 and displaying a shot image obtained by shooting a surgical site or the like. For example, the control part 11413 generates the control signal for controlling to drive the camera head 11102.

Further, the control part 11413 causes the display apparatus 11202 to display a shot image shooting a surgical site or the like therein on the basis of the image signal subjected to the image processing by the image processing part 11412. At this time, the control part 11413 may recognize various objects in the shot image by use of various image recognition technologies. For example, the control part 11413 detects the shapes, colors, and the like of the edges of the objects included in the shot image thereby to recognize a surgical tool such as forceps, a specific living body site, bleeding, mist during the use of the energy treatment tool 11112, and the like. When causing the display apparatus 11202 to display a shot image, the control part 11413 may overlap various items of surgery support information on the image of the surgical site to be displayed by use of the recognition result. The surgery support information is overlapped to be displayed, and is presented to the operator 11131 so that the loads on the operator 11131 can be alleviated and the operator 11131 can securely perform the operation.

The transmission cable 11400 connecting the camera head 11102 and the CCU 11201 is an electric signal cable for communication of electric signals, an optical fiber for optical communication, or a composite cable thereof.

Here, wired communication is made by use of the transmission cable 11400 in the illustrated example, but wireless communication may be made between the camera head 11102 and the CCU 11201.

An exemplary endoscopic surgery system to which the technology according to the present disclosure can be applied has been described above. The technology according to the present disclosure can be applied to the camera head 11102 among the above-described constituents, for example. Specifically, the electronic component 10 in the camera module 1 according to each embodiment described above can be applied to the shooting part 11402. The technology according to the present disclosure is applied to the shooting part 11402 so that the shooting part 11402 can be stably used for a long time.

Additionally, the endoscopic surgery system has been described herein by way of example, but the technology according to the present disclosure may be additionally applied to a microscopic surgery system and the like, for example.

11. APPLICATION TO MOVING OBJECT

Further, the technology according to the present disclosure (the present technology) is applicable to various products. For example, the technology according to the present disclosure may be realized as an apparatus mounted on any kind of moving object such as vehicle, electric vehicle, hybrid vehicle, motorcycle, bicycle, personal mobility, airplane, drone, ship, or robot.

Figure 14:
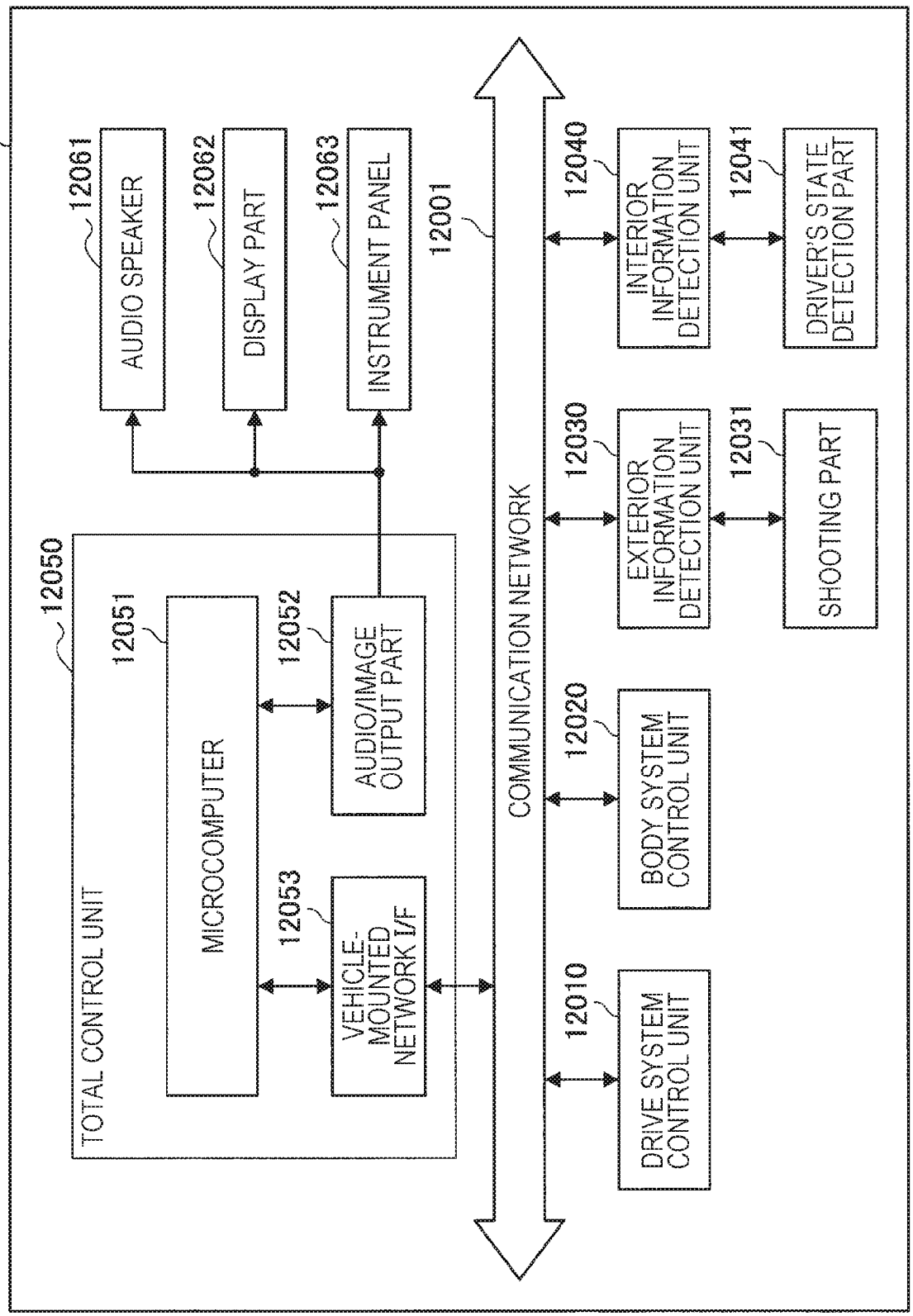
FIG. 14 is a block diagram illustrating an exemplary schematic configuration of a vehicle control system.

FIG. 14 is a block diagram illustrating an exemplary schematic configuration of a vehicle control system as an exemplary moving object control system to which the technology according to the present disclosure can be applied.

A vehicle control system 12000 includes a plurality of electronic control units connected via a communication network 12001. In the example illustrated in FIG. 14, the vehicle control system 12000 includes a drive system control unit 12010, a body system control unit 12020, an exterior information detection unit 12030, an interior information detection unit 12040, and a total control unit 12050. Further, a microcomputer 12051, an audio/image output part 12052, and a vehicle-mounted network interface (I/F) 12053 are illustrated as the functional components of the total control unit 12050.

The drive system control unit 12010 controls the operations of the apparatuses for the vehicle drive system according to various programs. For example, the drive system control unit 12010 functions as a control apparatus for a driving force generation apparatus such as internal engine or drive motor for generating a driving force of the vehicle, a driving force transmission mechanism for transmitting a driving force to the wheels, a steering mechanism for adjusting the steering angle of the vehicle, a braking apparatus for generating a braking force of the vehicle, and the like.

The body system control unit 12020 controls the operations of various apparatuses equipped in the vehicle body according to various programs. For example, the body system control unit 12020 functions as a control apparatus for a keyless entry system, a smart key system, a power window apparatus, or various lights such as head lights, back lights, brake lights, directional signals, or fog lights. In this case, a radio wave originated from a portable machine as a key, or signals of various switches can be input to the body system control unit 12020. The body system control unit 12020 receives the input of the radio wave or signals, and controls the door lock apparatus, the power window apparatus, the lights, and the like of the vehicle.

The exterior information detection unit 12030 detects the information indicating the exterior of the vehicle mounting the vehicle control system 12000 thereon. For example, the exterior information detection unit 12030 is connected with a shooting part 12031. The exterior information detection unit 12030 causes the shooting part 12031 to shoot an image of the exterior of the vehicle, and receives the shot image. The exterior information detection unit 12030 may perform a processing of detecting an object such as person, vehicle, obstacle, road sign, or character on the road, or a distance detection processing on the basis of the received image.

The shooting part 12031 is a light sensor for receiving light and outputting an electric signal depending on the amount of received light. The shooting part 12031 can output the electric signal as an image, or can output it as distance measurement information. Further, light received by the shooting part 12031 may be a visible ray or a non-visible ray such as infrared ray.

The interior information detection unit 12040 detects the information indicating the interior of the vehicle. The interior information detection unit 12040 is connected with a driver's state detection part 12041 for detecting a driver's state, for example. The driver's state detection part 12041 includes a camera for shooting the driver, for example, and the interior information detection unit 12040 may calculate a degree of fatigue or a degree of concentration of the driver or may determine whether the driver is asleep at the wheel on the basis of the detection information input from the driver's state detection part 12041.

The microcomputer 12051 can calculate a control target value of the driving force generation apparatus, the steering mechanism, or the braking apparatus on the basis of the information indicating the exterior or interior of the vehicle obtained by the exterior information detection unit 12030 or the interior information detection unit 12040, and can output a control instruction to the drive system control unit 12010. For example, the microcomputer 12051 can perform cooperative control for realizing the advanced driver assistance system (ADAS) functions including collision avoidance or collision alleviation of the vehicle, follow-up traveling based on inter-vehicle distance, traveling at kept vehicle speed, collision alarm of the vehicle, lane deviation alarm of the vehicle, and the like.

Further, the microcomputer 12051 controls the driving force generation apparatus, the steering mechanism, the braking apparatus, or the like on the basis of the information indicating the surrounding of the vehicle obtained by the exterior information detection unit 12030 or the interior information detection unit 12040, thereby performing cooperative control for automatic driving of autonomous traveling irrespective of driver's operation, and the like.

Further, the microcomputer 12051 can output a control instruction to the body system control unit 12020 on the basis of the information indicating the exterior of the vehicle obtained by the exterior information detection unit 12030. For example, the microcomputer 12051 can control the head lights depending on the position of a leading vehicle or an oncoming vehicle detected by the exterior information detection unit 12030, and can perform cooperative control in order to achieve anti-glare such as switching from high beam to low beam.

The audio/image output part 12052 transmits an output signal of at least one of audio or image to an output apparatus capable of visually or aurally notifying information to the passengers in the vehicle or the outside of the vehicle. In the example of FIG. 14, an audio speaker 12061, a display part 12062, and an instrument panel 12063 are illustrated as output apparatuses by way of example. The display part 12062 may include at least one of an on-board display or a head-up display, for example.

Figure 15:
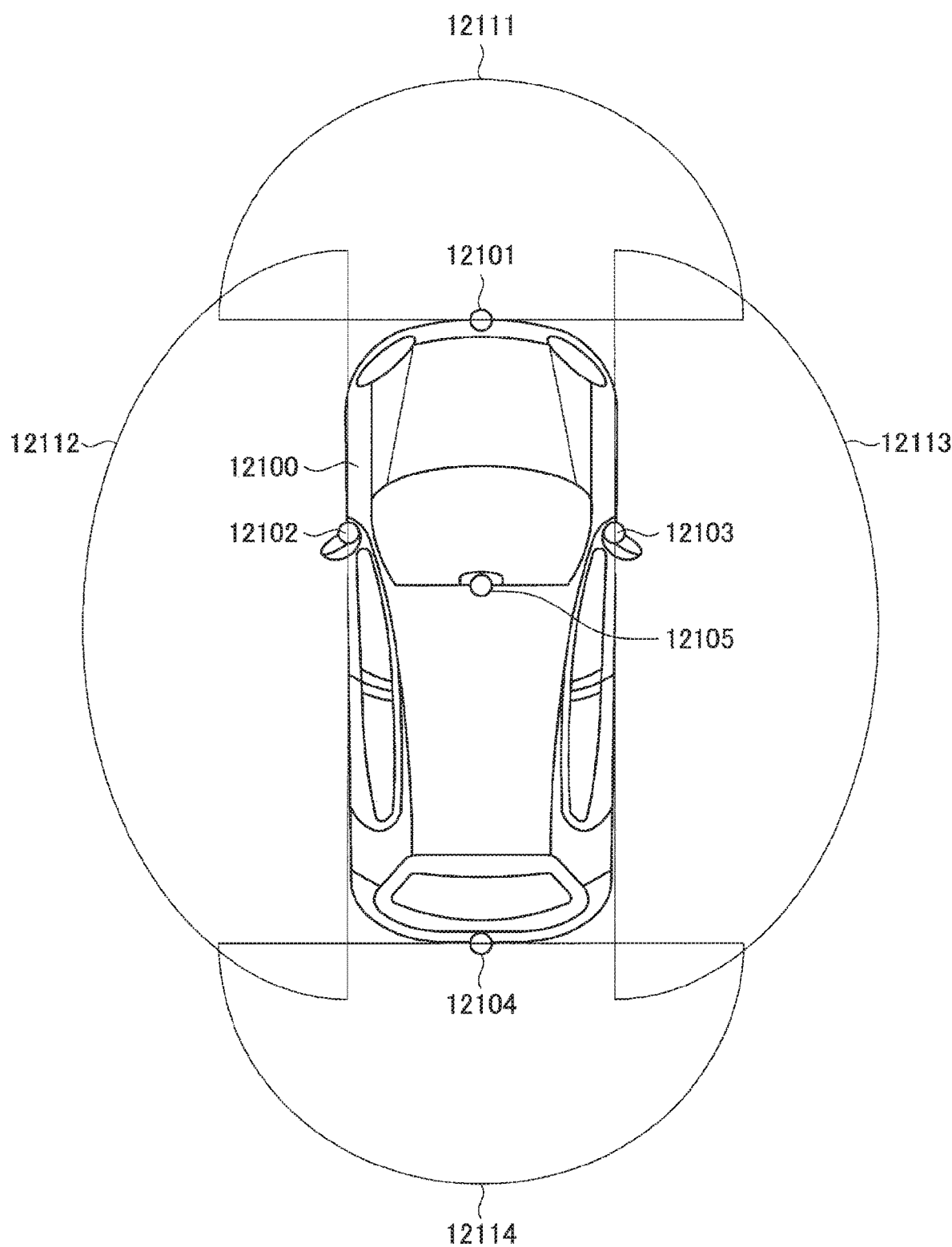
FIG. 15 is an explanatory diagram illustrating exemplary installation positions of an exterior information detection part and shooting parts.

FIG. 15 is a diagram illustrating exemplary installation positions of the shooting part 12031.

In FIG. 15, the vehicle 12100 has the shooting part 12031 including shooting parts 12101, 12102, 12103, 12104, and 12105.

The shooting parts 12101, 12102, 12103, 12104, and 12105 are provided at the front nose, the side mirrors, the rear bumper or back door, at the top part of the front shield inside the vehicle 12100, and the like, for example. The shooting part 12101 provided at the front nose and the shooting part 12105 provided at the top part of the front shield inside the vehicle mainly obtain images in front of the vehicle 12100. The shooting parts 12102 and 12103 provided at the side mirrors mainly obtain images on both sides of the vehicle 12100. The shooting part 12104 provided at the rear bumper or back door mainly obtains an image behind the vehicle 12100. The front images obtained by the shooting parts 12101 and 12105 are mainly used to detect a leading vehicle, a pedestrian, an obstacle, a traffic light, a road sign, a traffic lane, or the like.

Additionally, FIG. 15 illustrates exemplary shooting ranges of the shooting parts 12101 to 12104. A shooting range 12111 indicates a shooting range of the shooting part 12101 provided at the front nose, the shooting ranges 12112 and 12113 indicate the shooting ranges of the shooting parts 12102 and 12103 provided at the side mirrors, respectively, and a shooting range 12114 indicates a shooting range of the shooting part 12104 provided at the rear bumper or back door. For example, the image data shot by the shooting parts 12101 to 12104 are overlapped thereby to obtain a perspective image of the vehicle 12100 viewed from above.

At least one of the shooting parts 12101 to 12104 may have a function of obtaining distance information. For example, at least one of the shooting parts 12101 to 12104 may be a stereo camera configured of a plurality of imaging devices, or may be an imaging device having pixels for phase difference detection.

For example, the microcomputer 12051 finds a distance to each stereoscopic object in the shooting ranges 12111 to 12114 and a temporal change in the distance (relative speed to the vehicle 12100) on the basis of the distance information obtained from the shooting parts 12101 to 12104, thereby extracting, as a leading vehicle, a stereoscopic object traveling at a predetermined speed (0 km/h or more, for example) substantially in the same direction as the vehicle 12100, which is the closest stereoscopic object to the vehicle 12100 on the road. Further, the microcomputer 12051 can set an inter-vehicle distance to be previously secured behind the leading vehicle, and can perform automatic brake control (including follow-up stop control), automatic acceleration control (including follow-up start control), or the like. Cooperative control for automatic driving of autonomous traveling irrespective of driver's operation, and the like can be performed in this way.

For example, the microcomputer 12051 can classify and extract stereoscopic data regarding stereoscopic objects into two-wheel vehicle, standard-sized vehicle, large-sized vehicle, pedestrian, power pole, and the like on the basis of the distance information obtained from the shooting parts 12101 to 12104, and can use it for automatic obstacle avoidance. For example, the microcomputer 12051 discriminates the obstacles around the vehicle 12100 into obstacles capable of being visually confirmed by the driver of the vehicle 12100 and obstacles difficult to visually confirm. The microcomputer 12051 then determines a collision risk indicating a degree of risk of collision with each obstacle, and outputs an alarm to the driver via the audio speaker 12061 or the display part 12062 or performs forcible deceleration or avoidance steering via the drive system control unit 12010 when there is a collision possibility at a set value of collision risk, thereby performing driving support for collision avoidance.

At least one of the shooting parts 12101 to 12104 may be an infrared camera for detecting an infrared ray. For example, the microcomputer 12051 determines whether or not a pedestrian is present in the images shot by the shooting parts 12101 to 12104, thereby recognizing the pedestrian. The pedestrian is recognized in a procedure of extracting the characteristic points in the images shot by the shooting parts 12101 to 12104 as infrared cameras and a procedure of performing a pattern matching processing on a series of characteristic points indicating the contour of an object and determining whether or not the contour of the object is a pedestrian, for example. When the microcomputer 12051 determines that a pedestrian is present in the images shot by the shooting parts 12101 to 12104 and recognizes the pedestrian, the audio/image output part 12052 controls the display part 12062 to overlap a square contour line for emphasis on the recognized pedestrian for display. Further, the audio/image output part 12052 may control the display part 12062 to display an icon or the like indicating a pedestrian at a desired position.

An exemplary vehicle control system to which the technology according to the present disclosure can be applied has been described above. The technology according to the present disclosure can be applied to the shooting part 12031 among the above-described constituents. Specifically, the electronic component 10 in the camera module 1 according to each embodiment described above can be applied to the shooting part 12031. The technology according to the present disclosure is applied to the shooting part 12031 so that the shooting part 12031 can be stably used for a long time irrespective of various travelling environments.

12. CONCLUSION

The preferred embodiments of the present disclosure have been described above in detail with reference to the accompanying drawings, but the technical scope of the present disclosure is not limited to the examples. It is clear that those skilled in the art in the technical field of the present disclosure can assume various changes or modifications within the scope of the technical spirit described in CLAIMS, and it is of course understood that the changes or modifications belong to the technical scope of the present disclosure.

Further, the effects described in the present specification are merely explanatory or exemplary, and are not restrictive. That is, the technology according to the present disclosure can obtain other effects clear to those skilled in the art from the description of the present specification together with the above effects or instead of the above effects.

Additionally, the following configurations also belong to the technical scope of the present disclosure.

(1)

An electronic component including:

a base material having a first face and a second face;

a first layer provided on the first face of the base material and including a plurality of pads connected to a plurality of bumps of a chip flip-chip mounted on the first face of the base material, respectively; and a second layer provided on the second face of the base material, in which a contacting member arranged at apart contacting with the second face of the base material at a position corresponding to each of the plurality of pads in the second layer is made of the same material.

(2)

The electronic component according to (1), in which the contacting member includes at least one wiring formed on the second face of the base material.

(3)

The electronic component according to (2), in which the contacting member includes a member which is different from the at least one wiring and includes the same material as a material making the wiring.

(4)

The electronic component according to (1), in which the contacting member is different from wiring formed on the second face of the base material.

(5)

The electronic component according to (4), in which the member different from the wiring includes a resist member.

(6)

The electronic component according to (1), in which the contacting member includes a buffer member including a single material, and a buffer layer including the buffer member is formed on the second face of the base material.

(7)

The electronic component according to (6), in which the buffer member is formed over the entire buffer layer.

(8)

The electronic component according to (6), in which the buffer member is transversely formed over positions corresponding to each of the plurality of pads.

(9)

The electronic component according to any one of (1) to (8), in which the contacting member is arranged to include a region of a contact face between the pad and the bump at each of the plurality of pads in plan view.

(10)

The electronic component according to any one of (1) to (9), in which a circuit board having the base material, the first layer, and the second layer includes a multilayered board, and the base material is provided on an outermost surface layer of the multilayered board on a side of the chip.

(11)

The electronic component according to any one of (1) to (10), in which the chip includes an imaging device, the base material includes a main opening, and the imaging device is provided at a part corresponding to the main opening on the first face of the base material.

(12)

A camera module including:
a circuit board including:
a base material having a first face and a second face;
a first layer provided on the first face of the base material and including a plurality of pads connected to a plurality of bumps of an imaging device flip-chip mounted on the first face of the base material, respectively; and
a second layer provided on the second face of the base material;
a translucent member provided opposite to a side of the circuit board where the imaging device is provided; and
a lens unit provided opposite to a side of the translucent member opposing the circuit board,
in which a contacting member arranged at apart contacting with the second face of the base material at a position corresponding to each of the plurality of pads in the second layer is made of a same material.

REFERENCE SIGNS LIST

1 Camera module
2 Lens unit
3 Group of lenses
4 Holder
5 Housing
10 Electronic component
11 Circuit board
12 First layer
13 Second layer
14 Third layer
21 Imaging device
22 Bump
23 Translucent member
24 Encapsulation resin
25 Passive component
26 Reinforcement plate
100 Flip-chip bonding part
110, 111 Base material
110a First face
110b Second face
121 Wiring
122 Resist part
123 Pad
131 Wiring
132 Resist part
133 Dummy wiring
134 Buffer member
135 Resist part
136 Reinforcement part
142 Resist part

The invention claimed is:

1. An electronic component, comprising:
a circuit board including:
a base material having a first face and a second face;
a first layer on the first face of the base material, wherein
the first layer includes a plurality of pads,
the plurality of pads is connected to a plurality of bumps of a chip, respectively, and
the chip is flip-chip mounted on the first face of the base material;
a second layer on the second face of the base material; and
a contacting member including:
at least one wiring on the second face of the base material, wherein
the at least one wiring is at a first position that overlaps a first pad of the plurality of pads, and
the at least one wiring is electrically connected with the circuit board; and
a dummy wiring on the second face of the base material, wherein
the dummy wiring is at a second position that overlaps a second pad of the plurality of pads,
the dummy wiring is not electrically connected with the circuit board, and
the dummy wiring and the at least one wiring are made of a same material.

2. The electronic component according to claim 1, wherein
the contacting member further includes a buffer member on the second face of the base material, and
the buffer member is made of copper.

3. The electronic component according to claim 2, wherein the buffer member is over an entire surface of the second face of the second layer.

4. The electronic component according to claim 2, wherein the buffer member is transversely over positions corresponding to each of the plurality of pads.

5. The electronic component according to claim 1, wherein the contacting member further includes a region in which each of the plurality of pads is in contact with a respective bump of the plurality of bumps in plan view.

6. The electronic component according to claim 1, wherein
the circuit board is a multilayered board, and
the base material is on an outermost surface layer of the multilayered board on a side of the chip.

7. The electronic component according to claim 1, wherein
the chip includes an imaging device,
the base material includes a main opening, and
the imaging device is at a part that corresponds to the main opening on the first face of the base material.

8. The electronic component according to claim 1, wherein
the contacting member further comprises a resist member, and
the resist member covers the dummy wiring on the second face of the base material in the second layer.

9. A camera module, comprising:
an imaging device including a plurality of bumps;
a circuit board including:
    a base material having a first face and a second face;
    a first layer on the first face of the base material, wherein
        the first layer includes a plurality of pads,
        the plurality of pads is connected to the plurality of bumps of the imaging device, respectively, and
        the imaging device is flip-chip mounted on the first face of the base material;
    a second layer on the second face of the base material;
    a contacting member including:
        at least one wiring on the second face of the base material, wherein
            the at least one wiring is at a first position that overlaps a first pad of the plurality of pads, and
            the at least one wiring is electrically connected with the circuit board; and
        a dummy wiring on the second face of the base material, wherein
            the dummy wiring is at a second position that overlaps a second pad of the plurality of pads,
            the dummy wiring is not electrically connected with the circuit board, and
            the dummy wiring and the at least one wiring are made of a same material;
a translucent member opposite to a side of the imaging device on the circuit board; and
a lens unit on a side of the translucent member opposite to the side of the imaging device.

10. The camera module according to claim 9, wherein
the dummy wiring and the at least one wiring are made of copper.

* * * * *